(12) United States Patent
Shau

(10) Patent No.: US 6,504,745 B2
(45) Date of Patent: *Jan. 7, 2003

(54) HIGH PERFORMANCE ERASABLE PROGRAMMABLE READ-ONLY MEMORY (EPROM) DEVICES WITH MULTIPLE DIMENSION FIRST-LEVEL BIT LINES

(75) Inventor: Jeng-Jye Shau, Palo Alto, CA (US)

(73) Assignee: Uniram Technology, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/860,215

(22) Filed: May 18, 2001

(65) Prior Publication Data

US 2002/0039317 A1 Apr. 4, 2002

Related U.S. Application Data

(63) Continuation-in-part of application No. 08/805,290, filed on Feb. 25, 1997, now Pat. No. 5,825,704, and a continuation-in-part of application No. 08/653,620, filed on May 24, 1996, now Pat. No. 5,748,547.

(51) Int. Cl.$^7$ .................................................. G11C 5/06
(52) U.S. Cl. ......................................... 365/63; 365/51
(58) Field of Search ............................ 365/63, 51, 52, 365/207, 230.03

(56) References Cited

U.S. PATENT DOCUMENTS

| | | | | | |
|---|---|---|---|---|---|
| 4,799,197 | A | * | 1/1989 | Kodama et al. | 365/205 |
| 5,202,854 | A | * | 4/1993 | Koike | 365/205 |
| 5,748,547 | A | * | 5/1998 | Shau | 365/230.03 |
| 6,343,045 | B2 | * | 1/2002 | Shau | 365/227 |
| 6,344,760 | B1 | * | 2/2002 | Pyo | 365/205 |

* cited by examiner

Primary Examiner—Tan T. Nguyen
(74) Attorney, Agent, or Firm—Bo-In Lin

(57) ABSTRACT

A semiconductor erasable programmable read-only memory (EPROM) device provided for operation with a plurality of first level sense-circuits. The EPROM memory device includes an EPROM memory cell array having a plurality of first-direction first-level bit lines disposed in a parallel manner along a first direction. The EPROM memory device further includes a plurality of word lines intersected with the first-direction first-level bit lines. The EPROM memory cell array further includes a plurality of EPROM memory cells wherein each of the plurality of memory cells being coupled between one of the first-direction first level bit lines and one of the word lines for storing data therein. And, the EPROM memory device further includes a plurality of different-direction first level bit-lines disposed along at least one different direction different from the first direction. Each of the different-direction first-level bit lines connected between a plurality of the first-direction first level bit lines and one of the first level sense-circuits.

16 Claims, 31 Drawing Sheets

FIG. 2 (prior art multi-bank memory)
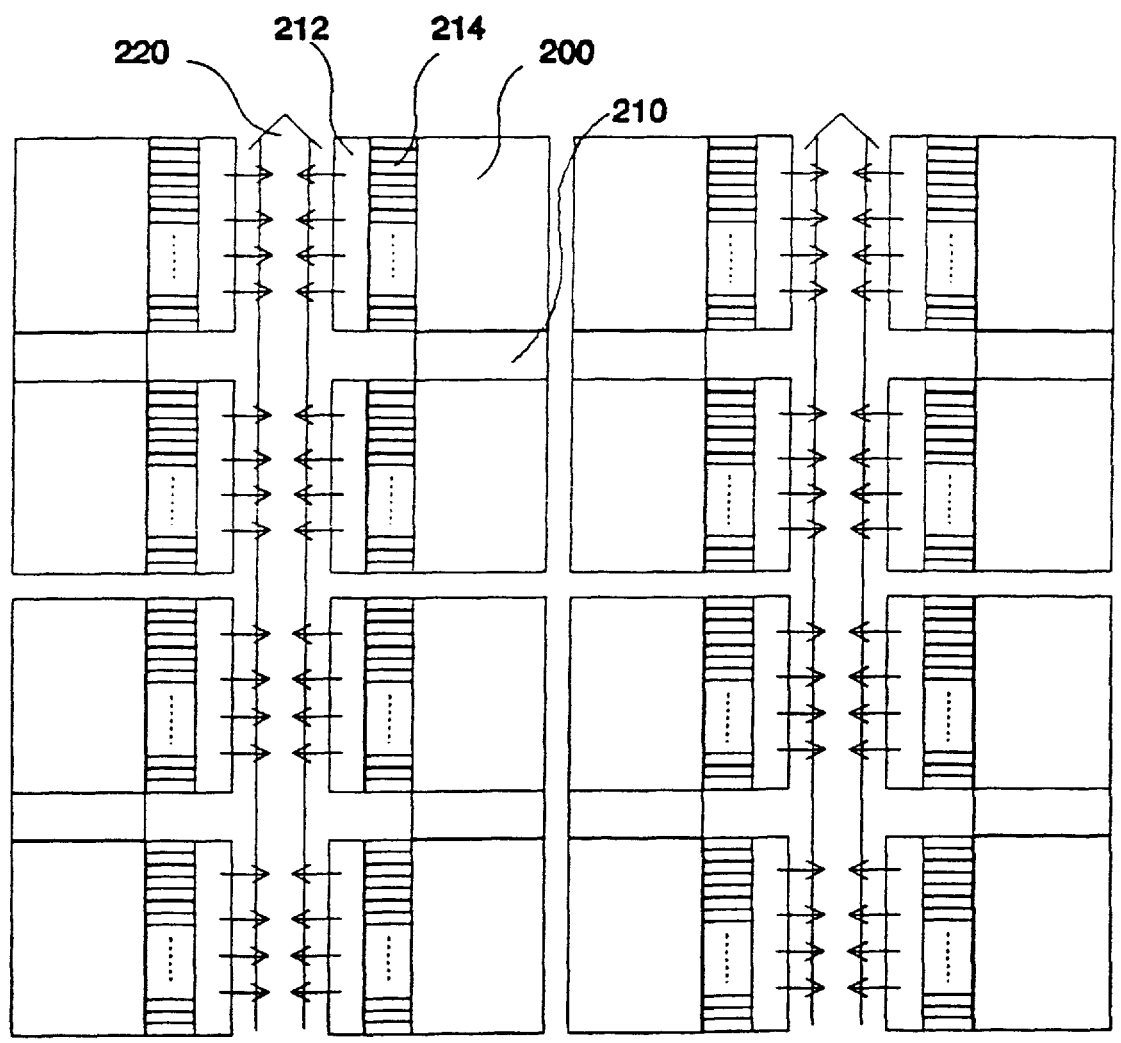

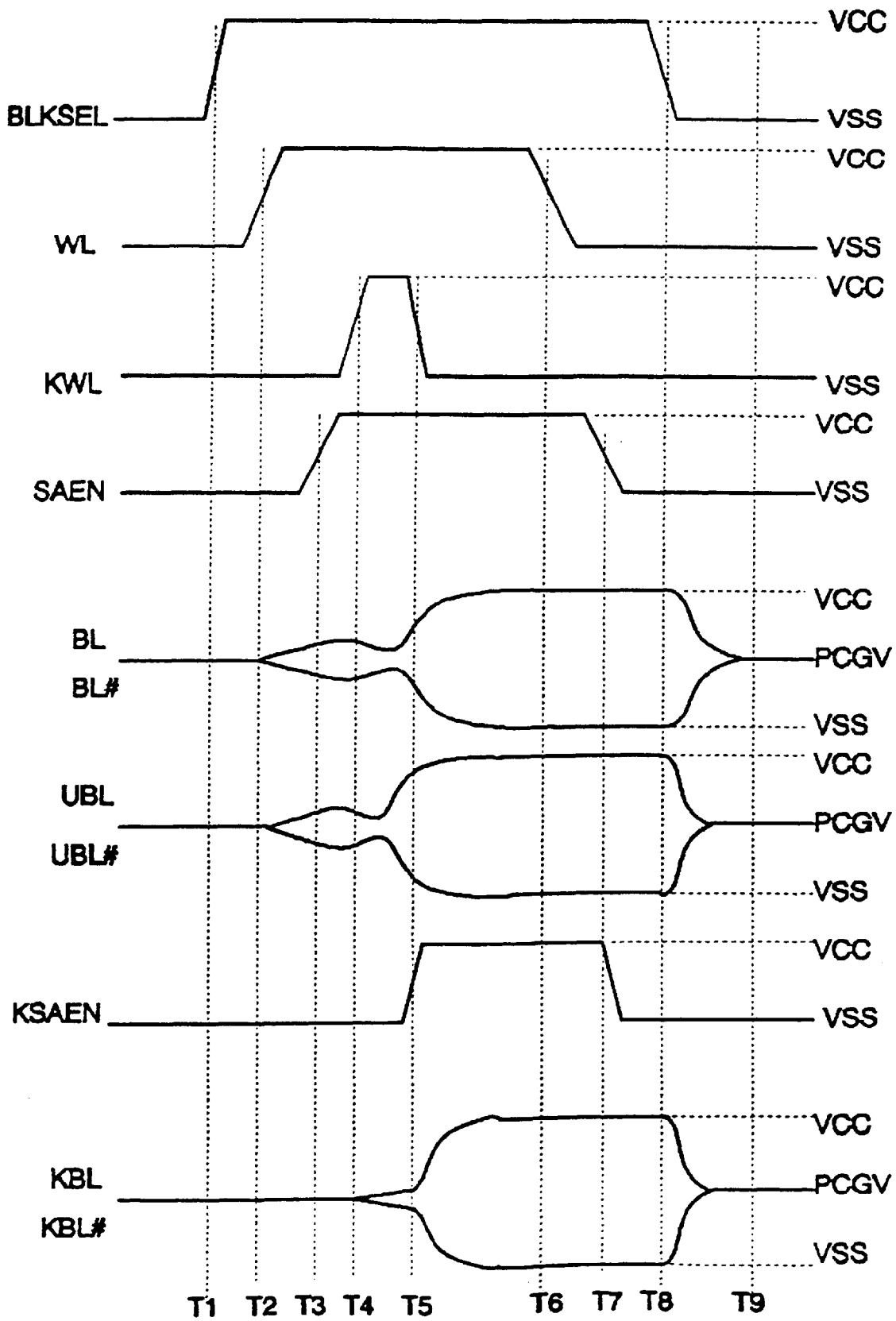
FIG. 7a (read cycle)

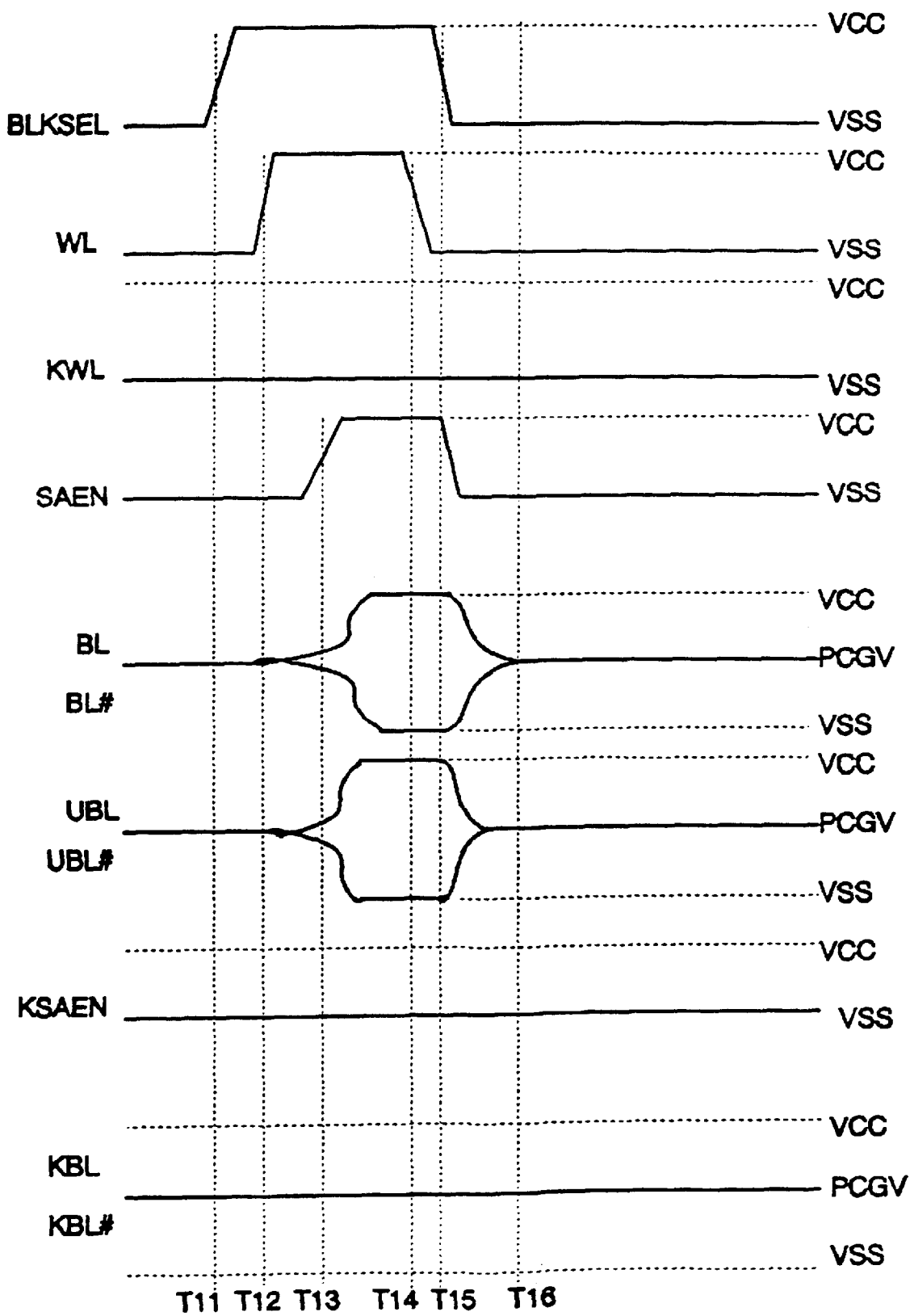
FIG. 7b (refresh cycle)

FIG. 7c (update cycle)
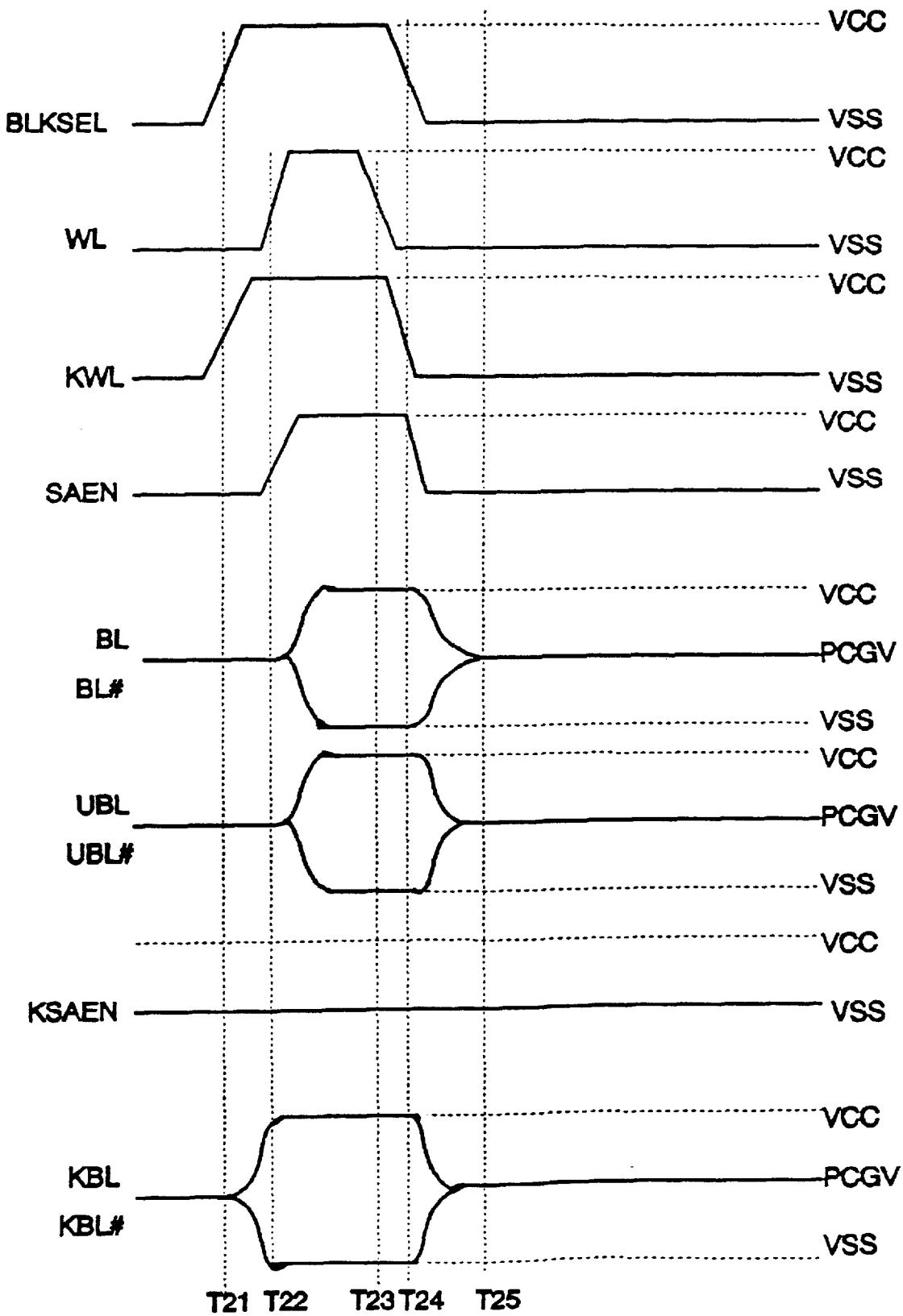

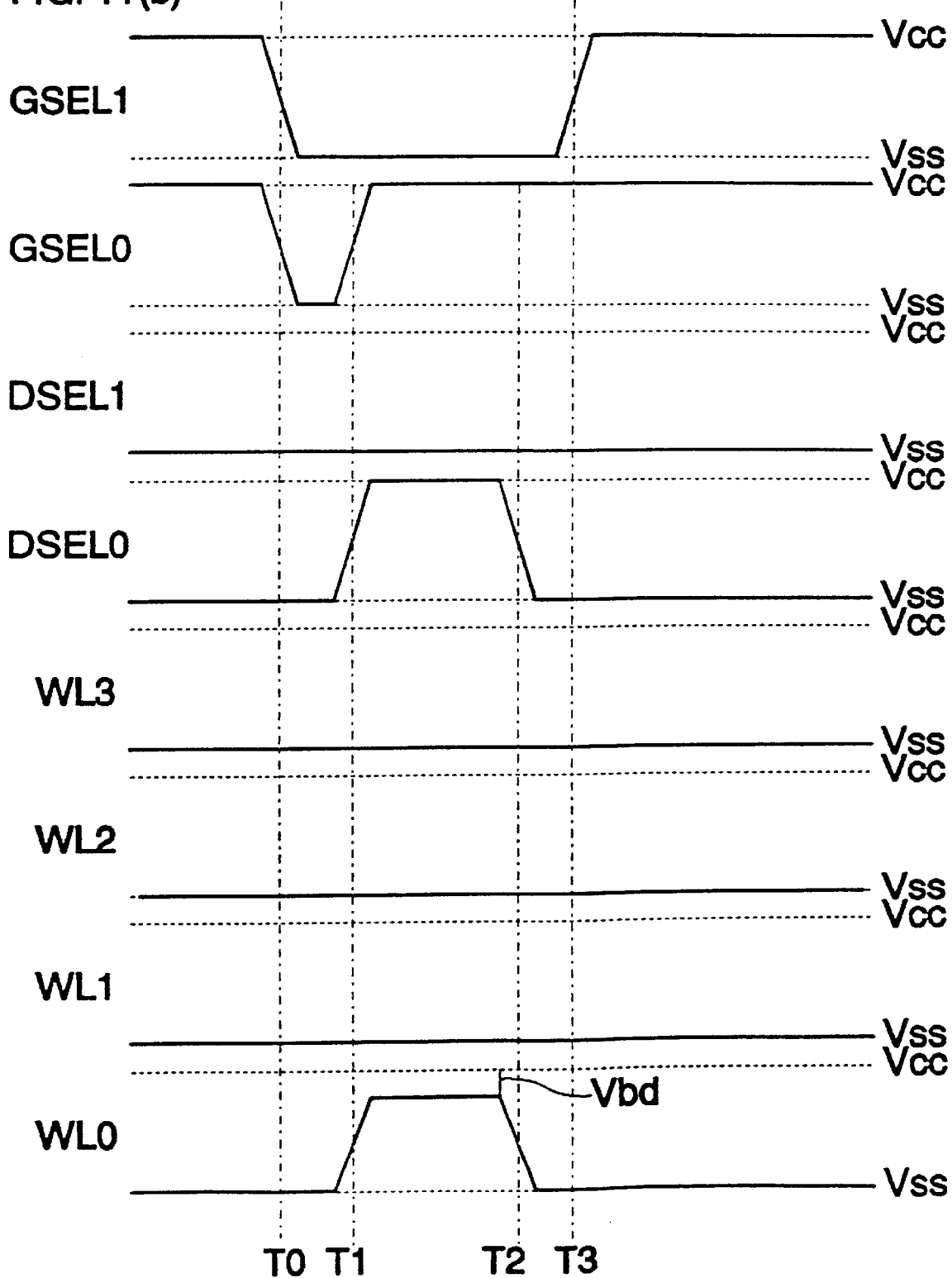

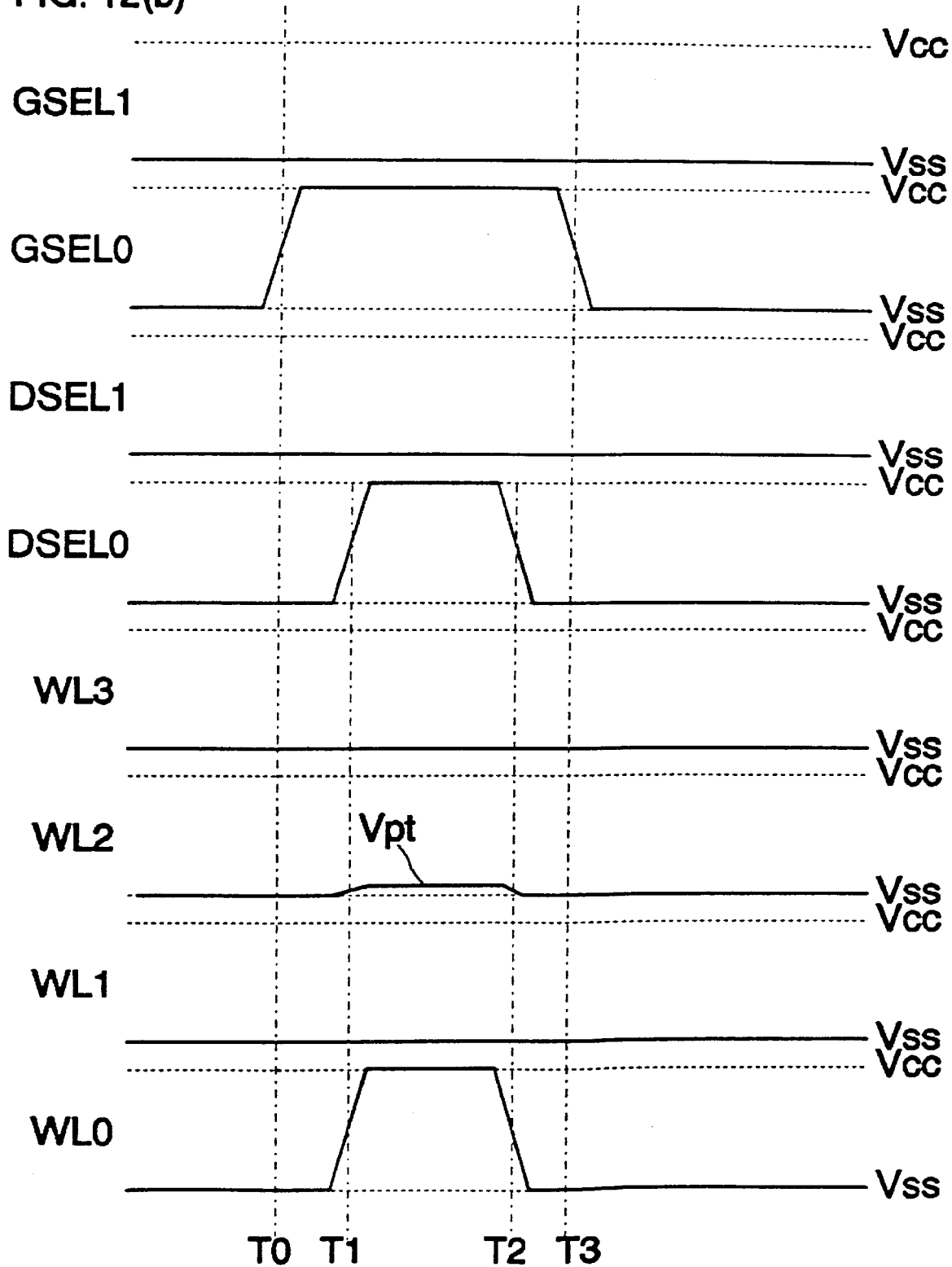

HIGH PERFORMANCE ERASABLE PROGRAMMABLE READ-ONLY MEMORY (EPROM) DEVICES WITH MULTIPLE DIMENSION FIRST-LEVEL BIT LINES

This is a Continuous-In-Part (CIP) application of a previously filed application with Ser. No. 08/653,620 filed on May 24, 1996 now U.S. Pat. No. 5,748,547 and another application Ser. No. 08/805,290 filed on Feb. 25, 1997 now U.S. Pat. No. 5,825,704 and an International Application filed in Taiwan Intellectual Property Bureau by identical sole investor as for this continuation-in-part application by identical sole inventor as for this continuation-in-part (CIP) application.

BACKGROUND OF THE INVENTION

1. Field of the Invention

The present invention relates to high performance semiconductor memory devices, and more particularly to embedded memory devices having first level bit lines connected along different layout directions. This invention is further related to erasable-programmable read-only (EPROM) memory arrays having first level bit lines connected along different layout directions and provided with error-code checking.

2. Description of the Prior Art

DRAM is usually considered as a high density, low cost, but low performance memory device. DRAM's of current art always have lower performance relative to other types of semiconductor memories such as static random access memory (SRAM). The density of DRAM has been improved rapidly; the extent of integration has been more than doubled for every generation. Such higher integration of DRAM has been realized mainly by super fine processing technique and improvements in memory cell structure. In the mean time, the improvement in DRAM performance is progressing at a much slower rate. This relatively slower improvement rate in performance generates a performance gap between logic devices and memory devices. Many new approaches have been proposed to reduce this performance gap. The synchronized DRAM (SDRAM), the extended data output (EDO) DRAM, the multiple bank DRAM (MDRAM), and the RAMBUS system approaches are the most well known methods to improve DRAM performance. U.S. Pat. No. 4,833,653 issued to Mashiko et al. and U.S. Pat. No. 4,758,993 issued to Takemae et al. disclosed DRAM having selectively activated subarrays in order to improve performance. Another approach to improve DRAM performance is to place an SRAM cache into DRAM (called "hybrid memory"). U.S. Pat. No. 5,421,000 issued to Fortino et al., U.S. Pat. No. 5,226,147 issued to Fujishima et al., U.S. Pat. No. 5,305,280 issued to Hayano et al. disclosed embodiments of hybrid memories. The major problem for above approaches is that they are paying very high price for performance improvement, while the resulting memory performance improvement is still not enough to fill the gap. Another problem is that all of those approaches require special system design that is not compatible with existing computer systems; it is therefore more difficult to use them in existing computer systems.

In U.S. Pat. No. 6,061,268, Kuo et al. disclose a two-port six-transistor (6 T) static random access memory (SRAM) cell structure with single-bit-line simultaneous read-write access capability using partially depleted silicon on insulator (SOI) CMOS dynamic threshold technique. In yet another U.S. Pat. No. 6,118,689 Kuo et al. disclose a two-port six-transistor SRAM cell with single-bit-line simultaneous read-and-write access capability. The source terminal of an NMOS device in the SRAM cell is connected to the write word line. FIG. 1A is a diagram for showing a SRAM disclosed by Kuo et al. that provides two port simultaneous read-and-write accesses. Kuo's structure is limited by access capability that one of bit-lines can be employed only for a read operation and another bit-line only for a writing operation. In order to gain more flexibility to read and write from both ports, another set of bit-lines has to be added as that shown in FIG. 1B. A dual port structure as shown in FIG. 1B occupies larger areas and becomes more complex in structure and less desirable. Even for a most basic single-port read/write operation, two bit-lines and one wordline, as that shown in FIG. 1C is required. As the size of a memory array is increased, these additional bitline occupies large areas and becomes a major design constraint to more a effective area utilization.

Another disadvantage of DRAM is the need to refresh its memory. That is, the users need to read the content of memory cells and write the data back every now and then. The system support for DRAM is more complex than SRAM because of this memory refresh requirement. Memory refresh also represents a waste in power. U.S. Pat. No. 5,276,843 issued to Tillinghast et al. discloses a method to reduce the frequency of refresh cycles. U.S. Pat. No. 5,305,280 issued to Hayano et al. and U.S. Pat. No. 5,365,487 issued to Patel et al. disclosed DRAM's with self-refresh capability. Those inventions partially reduce power consumption by refresh operations, but the magnitude of power saving is very far from what we can achieve by the present invention. The resource conflict problem between refresh and normal memory operations also remains unsolved by those patents.

Recently, Integrated Device Technology (IDT) announced that the company could make DRAM close to SRAM performance by cutting DRAM into small sub-arrays. The new device is not compatible with existing memory; it requires special system supports to handle conflicts between memory read operation and memories refresh operation. It requires 30% more area the DRAM, and its performance is still worse than SRAM of the same size.

Another important problem for DRAM design is the tight pitch layout problem of its peripheral circuits. In the course of the rapid improvement in reducing the size of memory cells, there has been no substantial improvement or change as to peripheral circuits. Peripheral circuits such as sense amplifiers, decoders, and precharge circuits are depend upon memory cell pitch. When the memory cells are smaller for every new generation of technology, it is more and more difficult to "squeeze" peripheral circuits into small pitch of memory layout. This problem has been magnified when the memory array is cut into smaller sub-arrays to improve performance. Each subarray requires its own peripheral circuits; the area occupied by peripheral circuits increases significantly. Therefore, in the foreseeable future, there may occur a case wherein the extent of integration of DRAM is defined by peripheral circuits. U.S. Pat. No. 4,920,517 issued to Yamauchi et al. disclosed a method to double the layout pitch by placing sense amplifiers to both ends of the memory. This method requires additional sense amplifiers. Although the available layout pitch is wider than conventional DRAM, the layout pitch is still very small using Yamauchi's approach.

All of the above inventions and developments provided partial solutions to memory design problems, but they also introduced new problems. It is therefore highly desirable to provide solutions that can improve memory performance without significant degradation in other properties such as area and user-friendly system support.

Another difficulty encountered by those of ordinary skill in the art is a limitation that Dynamic Random Access Memory (DRAM) which is usually considered as a high density, low cost, and low performance memory device cannot be conveniently integrated as embedded memory. This is due to the fact that higher integration of DRAM has been realized mainly by super fine processing technique and improvements in memory cell structure. A typical DRAM manufacture technology of current art is the four layer poly silicon, double layer metal (4P2M) process. Such memory technology emphasizes on super-fine structure in manufacture memory cells; performance of it logic circuit is considered less important. A technology optimized to manufacture high speed logic products have completely different priority; it emphasizes on performance of transistors, and properties of multiple layer metals. An example of a typical logic technology of current art is the triple layer metal, single polysilicon (1P3M) technology.

An embedded memory, by definition, is a high-density memory device placed on the same chip as high performance logic circuits. The major challenge to manufacture high density embedded memory is the difficulty in integrating two types of contradicting manufacture technologies together. An embedded technology of current art requires 4 layers of poly silicon and 3 layers of metal. There are more than 20 masking steps required for such technology. It is extremely difficult to have reasonable yield and reliability from such complex technology of current art. Further more, the current art embedded technology tend to have poor performance due to contradicting requirements between logic circuits and memory devices. None of current art embedded memory technology is proven successful. There is an urgent need in the Integrated Circuit (IC) industry to develop successful embedded memory devices.

The Applicant of this Patent Application has been successful in manufacturing embedded memory devices by novel approaches to change the architecture of IC memory so that the memory device no longer has conflicting properties with logic circuits. Examples of such architecture change have been disclosed in co-pending patent application Ser. No. 08/653,620. The previous application solved the tight pitch layout problems along the sense amplifier location, and it solves the self-refresh requirement by hiding refresh requirements. A pending continuation-in-part (CIP) Application further discloses solutions for remaining problems. A single-transistor decoder circuit solves the tight pitch layout problem along the decoder direction. Typical logic technology or small modifications of existing logic technology are applied to manufacture the memory cells. Using these novel inventions, high performance and high density embedded memory devices are ready to be manufactured.

The technical difficulties and limitations described and discussed above are generally applied to different types of memory devices including but not limited to DRAM, SRAM and erasable programmable read-only memory (EPROM) arrays. Therefore, a need is still exists in the art to improve the configuration and methods of design, manufacturing and implement the erasable programmable read-only memory (EPROM) arrays for enabling a person or ordinary skill in the art to resolve above mentioned technical difficulties and limitations.

SUMMARY OF THE PRESENT INVENTION

The primary objective of this invention is, therefore, to provide new circuit configuration and method to configure erasable-programmable read-only memory (EPROM) arrays. Another important objective is to make the EPROM device more user-friendly by making the performance improvement in parallel with simplification in system supports. Another primary objective is to provide an improved semiconductor memory device in which peripheral circuits can readily follow further higher integration of memory cells. Another objective is to reduce power consumption of high performance semiconductor memory.

Another important objective of this invention is to manufacture high-density memory device on the same chip with high performance logic devices without using complex manufacture technology. Another primary objective is to make embedded EPROM to have the same performance as high-speed logic circuits. Another primary objective is to improve yield and reliability of embedded memory products.

These and other objects are accomplished by a semiconductor memory device according to the invention. The memory device includes a novel architecture in connecting bit lines along multiple layout directions, a new design in decoder circuit, and a novel timing control that can finish a read cycle without waiting for completion of memory refresh.

According to the present invention as described herein, the following benefits, among others, are obtained.

(1) The multiple dimensional bit line structure dramatically reduces the parasitic loading of bit lines seen by sense amplifiers. Therefore, we can achieve significant performance improvement. Our results show that an EPROM memory of the present invention is faster than an SRAM of the same memory capacity.

(2) The multiple dimension bit line structure also allows us to use one sense amplifier to support many bit line pairs. Therefore, we no longer have tight pitch layout problem for sense amplifiers and other peripheral circuits. Removing tight pitch problem allows us to achieve performance improvement without paying high price in layout area.

(3) A novel decoder design reduces the size of memory decoder dramatically, that allow designers to divide the memory array into sub-arrays without paying high price in the area occupied by decoders.

(4) A novel input and output (IO) circuit design allows us to delay the memory refresh procedures until next memory operation. This approach allows us to "hide" refresh cycles and memory update cycles in a normal memory operation. The resulting memory device is as friendly as existing SRAM device. In fact, a memory of this invention can be made fully compatible with existing SRAM device.

(5) All of the above improvements are achieved by using much lower power than the power used by prior art EPROM arrays.

(6) The tight pitch layout problem along the decoder direction is solved. Therefore, we can divide a memory array into smaller blocks without sacrificing significant area. This architecture change allows us to use smaller storage capacitor for each DRAM or EPROM memory cell, which simplifies manufacture procedure significantly.

(7) High density EPROM and DRAM memory cells can be manufacture by adding simple processing steps to logic IC technology of current art. The resulting product supports high performance operation for both the memory devices and the logic circuits on the same chip.

(8) The simplification in manufacturing process results in significant improvements in product reliability and cost efficiency.

While the novel features of the invention are set forth with particularly in the appended claims, the invention, both as to organization and content, will be better understood and appreciated, along with other objects and features thereof, from the following detailed description taken in conjunction with the drawing.

BRIEF DESCRIPTION OF THE DRAWINGS

FIG. 2 is a simplified block diagram of a multiple bank semiconductor memory device;

FIG. 7a shows the waveforms of critical signals during a read cycle;

FIG. 7b shows the waveforms of critical signals during a refresh cycle;

FIG. 7c shows the waveforms of critical signals during a write cycle;

FIG. 11(b) is a diagram for the control signals and output signals of the decoder in FIG. 11(a);

FIGS. 12(b) and 12(c) illustrate the control signals and output signals of the decoder in FIG. 12(a);

DETAILED DESCRIPTION OF THE INVENTION

Before the invention itself is explained, a prior art semiconductor memory-device is first explained to facilitate the understanding of the invention.

Figure 1A:
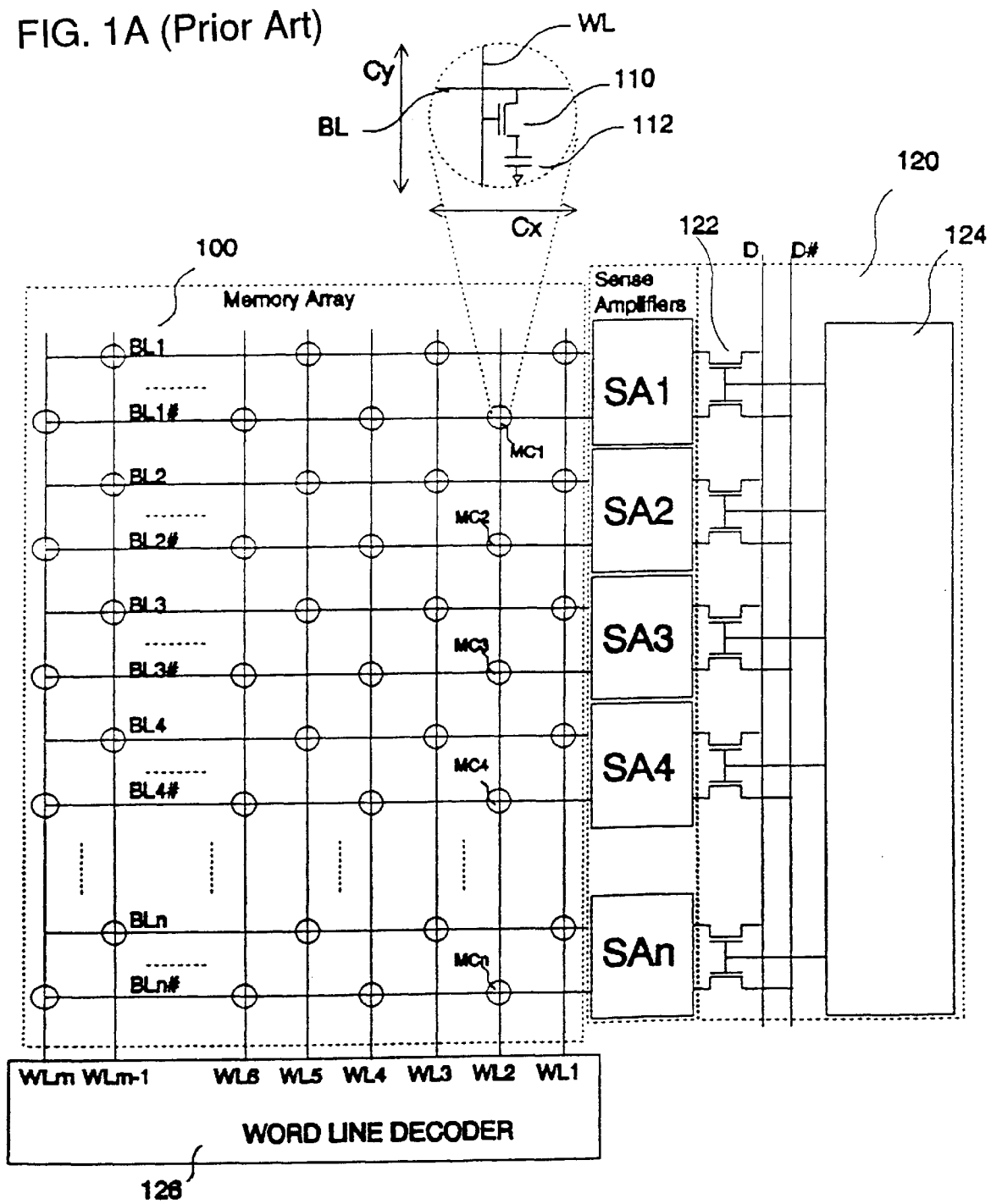
FIGS. 1A and 1B are schematic block diagrams of prior art memory devices constructed with DRAM and EPROM memory cells.
Figure 1B:
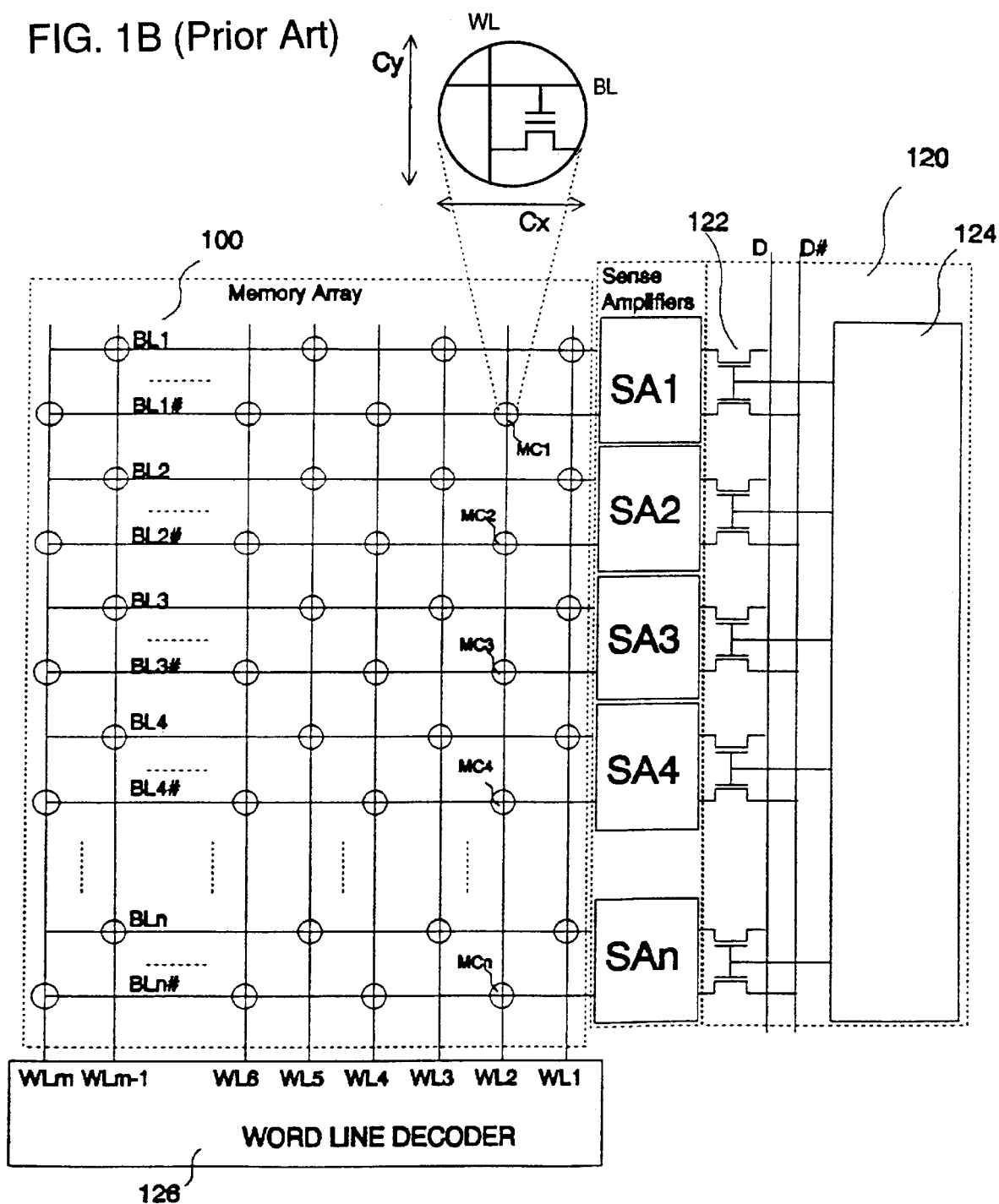

FIGS. 1A and 1B show the topographical structure and circuit connections of memory cell array of a prior art DRAM and EPROM arrays respectively. Memory cell array 100 includes plural pairs of bit lines BL1, BL1#; BL2, BL2#, BL3, BL3#; . . . ; BLn, BLn# (n; integer) which are disposed in parallel manner and a plurality of word lines WL1, WL2 . . . WLm (m; integer) which are disposed in parallel manner and also in such manner that they intersect with bit lines perpendicularly. At intersecting points, memory cells MC1, MC2, . . . , MCn are disposed. Memory cells are shown by circle marks in memory cell array 100 in FIG. 1. Each memory cell includes a switching field effect transistor 110 and memory cell capacitor 112. Bit line BL is connected to the drain of the transistor 110. The gate of transistor 110 is connected to word line WL. Sense amplifiers SA1, SA2, . . . SAn are disposed at one end of memory cell array and each pair of bit lines are connected to one sense amplifier. For example, a pair of bit lines BL1, BL1# are connected to sense amplifier SA1, a pair of bit lines BL2, BL2# are connected to sense amplifier SA2, . . . , and a pair of bit lines BLn, BLn# are connected to sense amplifier SAn. The outputs of those sense amplifiers are connected to data output switches 120. The output switches 120 contain a multiplexer 122 that is controlled by a decoder 124. The output switches 120 select the outputs from one of the sense amplifiers, and place the data on the data buses D and D#.

For example, when information is read out from memory cell MC1, the following operations are carried out. First, word line WL2 is selected by the word line decoder 126 and the transistor 110 in memory cell MC1 is rendered conductive. Thereby, signal charge in capacitor 112 of memory cell MC1 is read out to bit line BL1# so that minute difference of electric potential occurs between a pair of bit lines BL1 and BL1#. The sense amplifier SA1 amplifies such difference. The output switches 120 select the outputs of SA1 and thereafter, transfer the data to data buses D, D# through a multiplexer 122. After the above read procedure, the charge stored in the cell capacitor 112 is neutralized. It is therefore necessary to write the original data sensed by SA1 back to the memory cell MC1. Such procedure is called "refresh". The sense amplifier used in current art always refreshes the memory cell after it determines the state of the memory cell. It is very important to remember that all the other memory cells along the word line, MC2, MC3, . . . MCn, are also rendered conductive when WL2 is selected. It is therefore necessary to turn on all the other sense amplifiers SA2, SA3, . . . SAn to read and refresh the data stored in all other memory cells connected to WL2, when we only need the data stored in MC1.

Memory arrays of DRAM and EPROM of such structure have the following drawbacks.

(1) In order to read the data from a few memory cells along one word line, we need to read and refresh all the memory cells along that word line. Most of the energy is used for refreshing instead of reading data. This waste in energy also results in slower speed because a large number of devices need to be activated.

(2) As the size of the memory array increases, the bit line parasitic capacitance (Cb) increases. The ratio between the memory cell capacitance Cm and the bit line parasitic capacitance Cb determines the amplitude of the potential difference on the bit line pairs. The memory read operation is not reliable if the (Cm/Cb) ratio is too small. Thereby, the (Cm/Cb) ratio is often the limiting factor to determine the maximum size of a memory array. Special manufacturing technologies, such as the trench technology or the 4-layer poly technology, have been developed to improve the memory cell capacitance Cm. However, the Cm/Cb ratio remains a major memory design problem.

(3) To support refresh procedures, we always need to have one sense amplifier for each bit line pair. As higher integration of memory cells progresses, the layout pitch for sense amplifier decreases. Thereby, it becomes difficult to form stable and well operable sense amplifier within the pitch. Such problem is often referred as the "tight pitch layout" problem in the art of integrated circuit design. Tight pitch layout always results in excessive waste in silicon area due to the difficulty in squeezing active devices into a narrow space. Similar problem applies to other peripheral circuits such as decoders and pre-charge circuits.

To reduce the effect of the above problems, large memory of prior art is always divided into plural sub-arrays called memory banks 200 as shown in FIG. 2. Each bank 200 of the memory sub-array has its own decoder 210 and output switches 212. Each pair of the bit lines in each memory bank needs to have one sense amplifier 214. The outputs of each memory bank are selected by output switches 212, and placed on data buses 220 so that higher order amplifiers and decoders can bring the data to output pins.

This multi-bank approach provides partial solutions to the problems. Because each memory bank is capable of independent operation, we can reduce power consumption by keeping unused memory banks in low power state. The speed is also improved due to smaller active area. The (Cm/Cb) ratio can be kept at proper value by limiting the size of each memory bank. Multiple-bank memory allows us to turn on a sub-set of sense amplifiers to save power, but each bit line pair still needs to have one sense amplifier because we still need to refresh the contents of all activated memory cells. This multi-bank approach provides partial solutions, but it creates new problems. Each memory bank needs to have a full set of peripheral circuits; the areas occupied by the peripheral circuits increase significantly. Smaller size of memory bank implies higher percentage of area spent on peripheral circuits. Balancing the requirement between (Cm/Cb) ratio and the increase in tight pitch layout peripheral circuits is a major design problem for multiple bank memories. Yamauchi et al. were able to double the pitch for sense amplifiers by placing sense amplifiers at both sides of the memory array, but the layout pitch is still too small. Many other approaches have been proposed, but all of them provided partial solutions to part of the problems while created new problems.

Figure 3A:
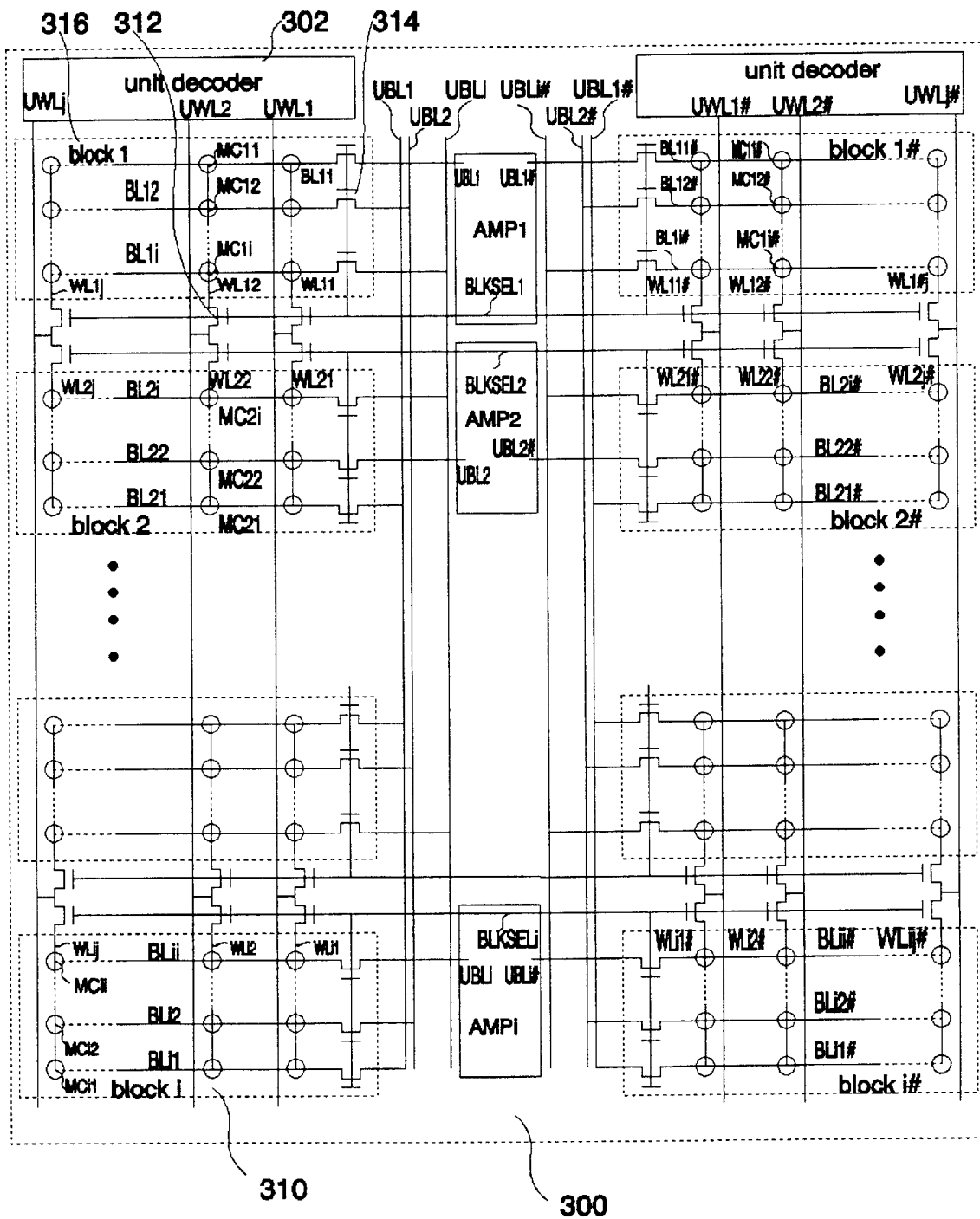
FIG. 3a is a schematic block diagram of a memory device with two-dimensional bit lines.

This invention is made to solve the above-stated problems. FIG. 3a shows memory structure of one embodiment of the present invention in both electrical and topographical manners. The building block of the present invention is a memory unit 300. Each memory unit contains decoders 302, amplifiers AMP1, AMP2, . . . , AMPi, and a plurality of memory blocks 310. These memory blocks are arranged in pairs; memory block 1# is symmetrical to memory block 1; memory block 2# is symmetrical to memory block 2; . . . ; and memory block i# is symmetrical to memory block i. Each memory block contains word line switches 312, bit line switches 314, and a small memory array 316. The word line switches 312 and bit line switches 314 are controlled by block select signals. For example, the block select signal BLKSEL1 controls the word line switches and the bit line switches in memory block 1 and in memory block 1#. The memory array contains memory cells similar to the memory cells in FIG. 1. Circle marks are used to represent those memory cells in FIG. 3a. Each memory cell is connected to a short word line and a short bit line within each memory block. For example, in memory block 1 the gate of the memory cell MC12 is connected to block word line WL12 and block bit line BL12. Each block word line is connected to one unit word line through a word line switch 312. For example, WL12 is connected to UWL2 through a word line switch 312 controlled by block select signal BLKSEL1; WL22 is connected to UWL2 through a word line switch controlled by block select signal BLKSEL2; . . . ; WLij is connected to UWLj through a word line switch controlled by block select BLKSELi (i and j are integers). In this example, the memory unit has two levels of bit lines-the unit level bit lines UBL1, UBL1#, UBL2, UBL2# . . . UBLn, UBLn# and the block level bit lines BL11, BL11#, BL12, BL12#, . . . et al. The block bit lines are made by the first layer metal (metal 1), and they are disposed vertical to the word lines. The unit bit lines are made by the second layer metal (metal 2), and they are disposed in parallel to the word lines. Each block bit line is connected to one unit bit line through one bit line switch 314 in each block. For example, BL12 is connected to UBL2 through a bit line switch controlled by block select signal BLKSEL1; BL22 is connected to UBL2 through a bit line switch also controlled by block select signal BLKSEL2; . . . ; BLii is connected to UBLi through a bit line switch controlled by block select BLKSELi. Each pair of unit bit lines is connected to one amplifier. For example, UBL1 and UBL1# are connected to AMPL; UBL2 and UBL2# are connected to AMP2; . . . ; UBLi and UBLi# are connected to AMPi. Those unit-bit-lines and block-bit-lines form a two-dimensional network that allows one amplifier to support bit line pairs in many blocks.

This two-dimensional bit line connection allows us to read the memory content with little waste in power. For example, when information is read out from memory cells on WL12 in block 1, the following operations are carried out. First, the block-select signal BLKSEL1 is activated, while all other block select signals remain inactive. All the word line switches 312 and bit line switches 314 in memory block 1 and in memory block 1# are rendered conductive, while those of all other memory blocks remain inactive. The unit decoder 302 activates the unit word line UWL2 while keeping other unit word lines inactive. Therefore, only WL12 is activated while all other block word lines remain inactive. The transistor 110 in memory cell MC12 is rendered conductive. Thereby, signal charge in capacitor of memory cell MC12 is read out to block bit line BL12 and to unit bit line UBL2 through the block bit line switch 314. In the mean time, BL12# is also connected to UBL2# through the block bit line switch in memory block 1#, but there is no signal charge read out to UBL2# because WL12# remains inactive. Since the bit lines in the memory block pairs are drawn in mirror symmetry, their parasitic capacitance is matched. The signal charge in memory cell MC12 develops a minute difference of electric potential between UBL2 and UBL2#. Such difference is detected and is amplified by sense amplifier AMP2; the result is sent to high order data bus (not shown), and is used to refresh memory cell MC12. Similarly, the content of memory cell MC11 is read and refreshed by sense amplifier AMP1; the content of memory cell MCi1 is read and refreshed by sense amplifier AMPi.

If we want to read the data from memory cells on WL12# in block 1#, the procedure is identical except that the unit decoder 302 should activate UWL2# instead of UWL2. If we want to read from memory cells in WLij in block i, the unit decoder 302 should turn on UWLj and the block select signal BLKSELi should be activated. The content of memory cell MCi1 is read and refreshed by sense amplifier AMPL; the content of memory cell MCi2 is read and refreshed by sense amplifier AMP2; . . . ; and the content of memory cell MCii is read and refreshed by sense amplifier AMPi.

It is still true that one sense amplifier is activated for each activated memory cell; otherwise the data stored in the memory cell will be lost. The differences are that the activated sense amplifiers are no longer required to be placed right next to the local bit lines connected to the activated memory cell and that the number of activated memory cells is only a small fraction of that of a prior art memory arrays. Such memory arrays may comprise DRAM, EPROM or other types of memory cells. The multiple dimensional bit line structure allows us to place the activated sense amplifier far away from the activated memory cells without introducing excessive parasitic loading to the bit lines. The layout pitches of sense amplifier and peripheral circuits are independent of the size of memory cell. It is therefore possible to design high performance peripheral circuits without increasing the area significantly.

It is to be understood that the present invention describes multiple dimension bit line structure "before" the first level sense amplifiers detect the storage charges in the activated memory cells. Prior art multi-bank arrays of DRAM and EPROM often has multiple dimension data buses "after" the first level sense amplifier already detected the storage charge in activated memory cells. The prior art multi-bank memories need one first level sense amplifier for every bit line pairs, and they do not solve the tight pitch layout problem.

While specific embodiments of the invention have been illustrated and described herein, it is realized that other modification and changes will occur to those skilled in the art. For example, the above embodiment assumes that bit line pairs are rendered in opposite memory block pairs. It should be obvious to those skilled in the art that this invention also can support the conventional bit line pairing structure in FIG. 1 where bit line pairs are arranged right next to each other. It is also obvious that the above two-dimensional bit line structure can be easily expanded to three-dimensional or multi-dimensional bit line structures. A two dimensional bit line structure is described in FIG. 3a for its simplicity, but the number of levels of bit line structures is not limited by the above example. The optimum levels of bit line structures are determined by details of manufacture technology and by the design specifications.

It also should be obvious that the bit line switches are not required elements; the unit bit lines can be connected directly to block bit lines without bit lines switches. Bit line switches help to reduce the bit line capacitance seen by each sense amplifier, but they are not required for functional reason because the word line switches already can isolate the memory cells in each memory block from memory cells in other memory blocks. While one sense amplifier is placed in each pair of memory block in the above example, there is no such constraint in this invention. We can place more than one sense amplifier per memory block, or place one sense amplifier in the area of many memory blocks. Because of a structure of multiple dimension bit line, the present invention completely removes the layout constraint between memory array and peripheral circuits.

Figure 3B:
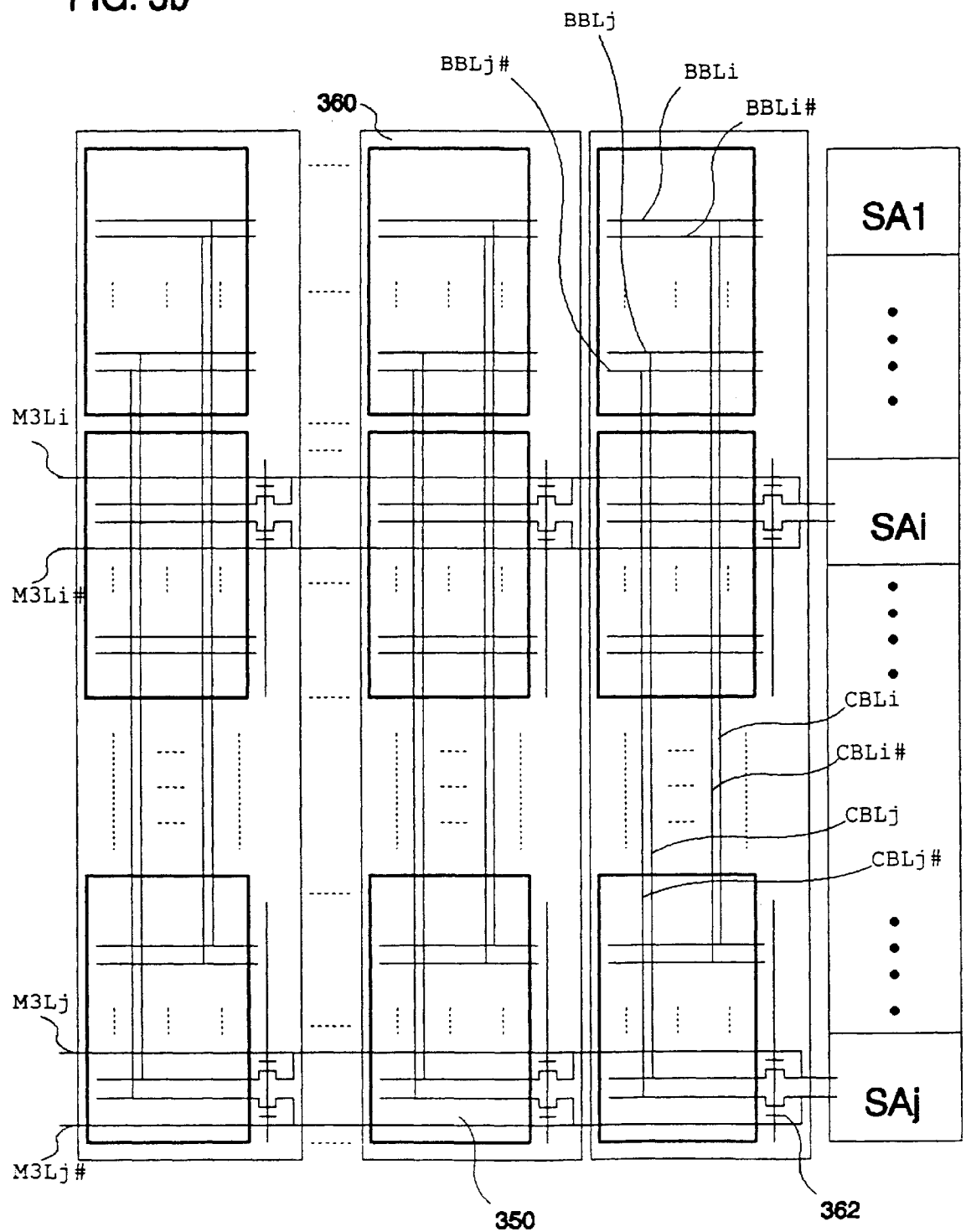
FIG. 3b is a schematic block diagram of a memory device with three-dimensional bit lines.

FIG. 3b shows a memory array of the present invention with 3-level bit line connections. For simplicity, only two pairs of bit lines are shown in this figure. The first level of bit lines are made by the first layer metal (M1), the second level is made by the second layer metal (M2), and the third level is made by the third layer metal (M3). Each memory block 350 contains a plurality of side-by-side M1 bit line pairs (BBLi, BBLi#), (BBLj, BBLj#). This memory array contains a plurality of memory columns 360. The M1 bit lines are connected to corresponding M1 bit lines in other memory blocks along the same memory column 360 by M2 bit lines CBLi, CBLi#, CBLj, CBLj#. The bit lines in each column are connected to the bit lines in other columns using metal 3 bit lines M3Li, M3Li#, M3Lj, M3Lj# through bit line switches 362. For each bit line in one memory column 360, we only need one bit line switch 362 and one M3 bit line. A group of sense amplifiers SA1, . . . ,Sai, . . . SAj, are placed at one end of the memory array. Each pair of the above three-dimension bit line networks are connected to one sense amplifier. For example, the (BBLi, CBLi, M3Li), (BBLi#, CBLi#, M3Li#) pair are connected to SAi, and the (BBLi, CBLi, M3Li), (BBLi#, CBLi#, M3Li#) pair are connected to SAj. Since each memory block 350 has its own word line switch (not shown in FIG. 3b), no more than one memory block in the network can be activated at any time. It is therefore possible to support a large number of memory cells using a small number of sense amplifiers without violating the requirement that every activated memory cell must have an activated sense amplifier to detect its storage charge.

Although the bit line structure in FIG. 3b is the actual bit line structure used in our product, for simplicity, we will use the simpler two-dimensional bit line structure in FIG. 3a as example in the following discussions.

Figure 4A:
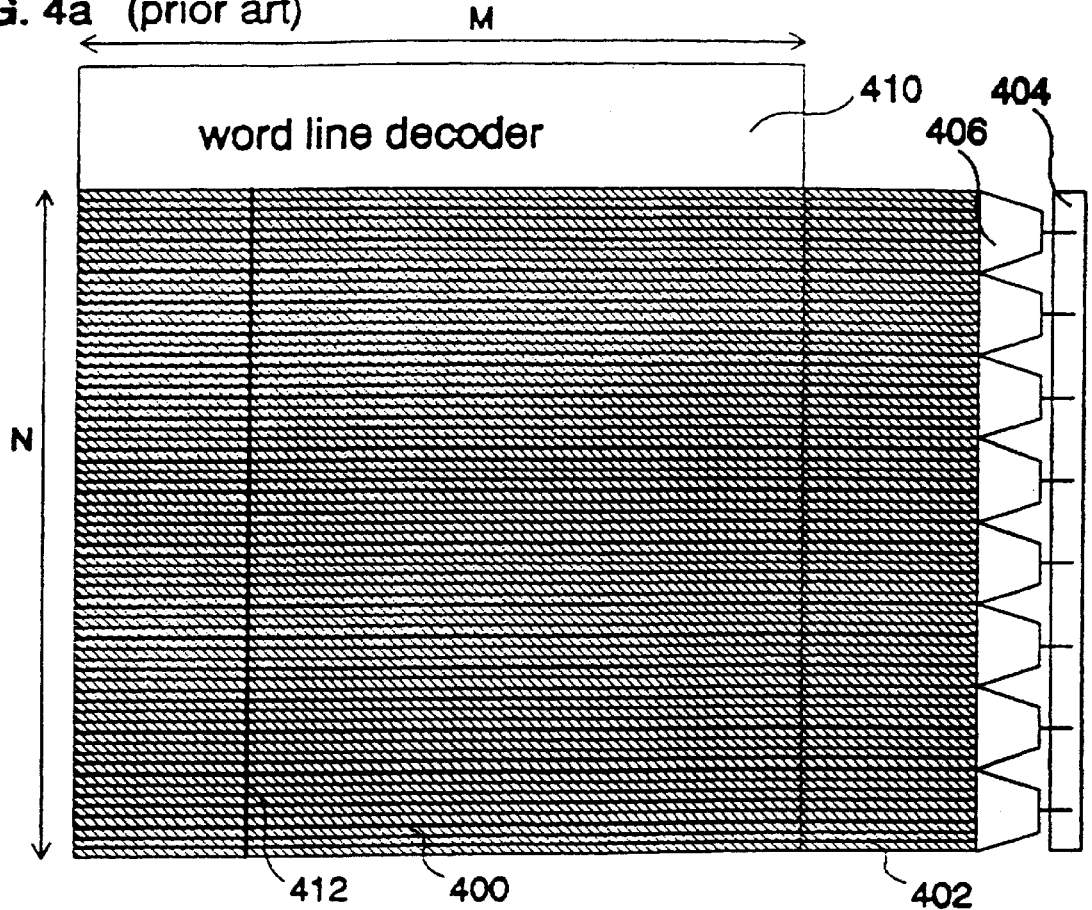
FIG. 4a is an illustration showing layout and power consumption of a prior art memory bank.

The difference in layout area and the difference in power consumption between the prior art and this invention are illustrated by the simplified block diagrams in FIGS. 4(a,b). FIG. 4a shows a simplified symbolic graph of one memory bank of conventional EPROM memory array 400 that has N bit line pairs, M word lines, and 8 output (N and M are integers). The sense amplifiers are represented by long rectangles 402 in FIG. 4a. Because one sense amplifier supports each bit line pair, the layout pitch for the sense amplifier is the layout pitch of a bit line pair, so that they must be placed in long narrow rectangular area. The outputs of the sense amplifiers are selected into 8 outputs by the output decoder 404 and multiplexers 406. The layout pitch for the output decoder 404 is also very narrow. The layout pitch for each element of the word line decoder 410 is the pitch of one memory cell Cx. For a memory operation, one word line 412 is activated across the whole memory bank. The number of active memory transistors is N. All N sense amplifiers are activated, and all N bit line pairs in this memory bank are charged or discharged by the sense amplifiers. The activated area covers the whole memory bank as illustrated by the shaded area in FIG. 4a.

Figure 4B:
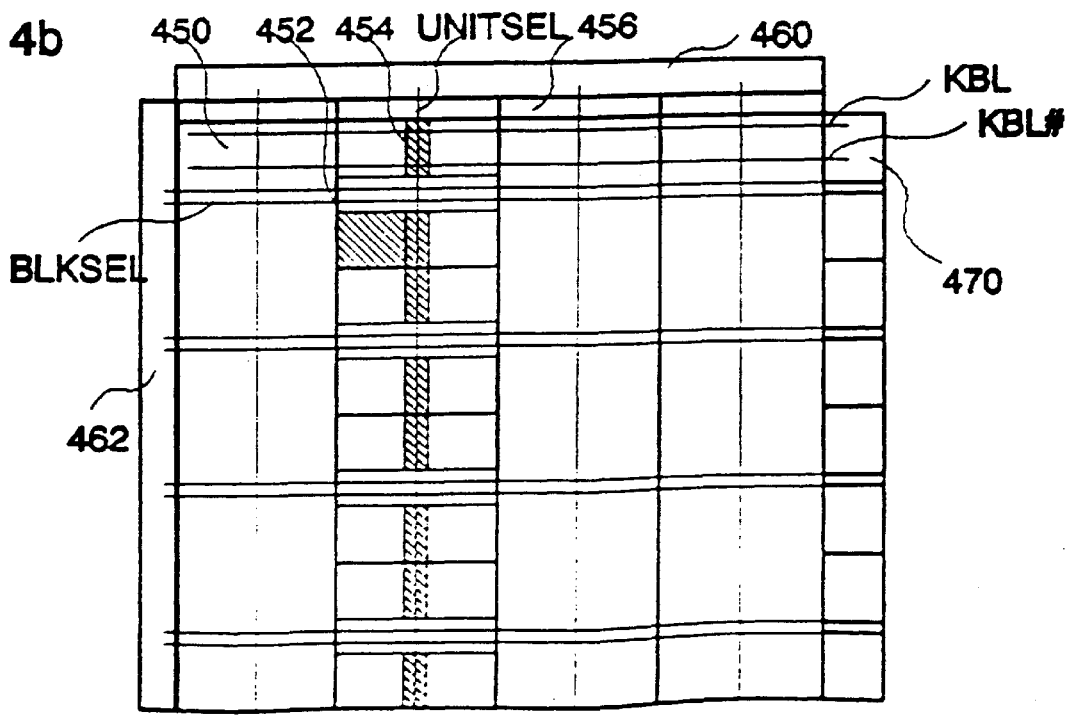
FIG. 4b is an illustration showing layout and power consumption of a semiconductor memory device of a first embodiment according to the invention.

FIG. 4b is a simplified symbolic graph of one bank of EPROM memory array of the present invention. For simplicity in comparison, we assume that the memory array in FIG. 4b contains the same number of memory cells and the same number of data outputs as the memory array in FIG. 4a. The memory bank is divided into 4 units 450, and each unit contains 8 pairs of memory blocks 452. We have one amplifier 454 for each pairs of memory blocks. Each unit has one unit word line decoder 456. Detailed structure of the memory unit has been described in FIG. 3a. A unit select decoder 460 generates unit select signals XBLKSEL along word line directions. A block select decoder 462 generates bank level block select signals YBLKSEL. A memory block 452 is activated when both XBLKSEL and YBLKSEL crossing the block are activated. The local block select signals are generated by AND gates in the amplifier 454 area. The outputs of each amplifier is placed on bank level bit lines KBL, KBL# to input/out (IO) units 470 at the edge of the memory. For simplicity, only one pair of bank level bit lines are shown in FIG. 4b. Further details of those peripheral circuits will be discussed in following sections. FIG. 4b shows that the layout pitch for the sense amplifiers 454 is 8 times wider than that in FIG. 4a. The peripheral circuits no longer require tight pitch layout, so that we can design them efficiently for both speed and area consideration. For a memory operation, only one memory block 452 and 8 sense amplifiers 454 in the selected unit 450 are activated. The shaded area in FIG. 4b illustrates the activated area. This active area is obviously much smaller than the active area of a conventional memory bank shown in FIG. 4a. Power consumption of the present invention is therefore much less than that of a prior art memory.

The parasitic bit line parasitic capacitance Cbp of the prior art memory in FIG. 4a is $$Cbp = (M/2)*Cd + M*Cm1 \quad (1)$$

And, where Cd is the diffusion capacitance for one bit line contact, Cm1 is the metal 1 capacitance of the bit line for each unit cell, and M is the number of memory cells along one bit line. We assume that two memory cells share each contact so that the total number of contacts is M/2.

The parasitic bit line capacitance Cb of the memory in FIG. 4b is $$Cb = (M/16)*Cd + (M/8)*Cm1 + (8*Cd + N*Cm2) \quad (2)$$

where Cm2 is the metal 2 bit line capacitance for each memory pitch along the unit bit line direction. The first two terms (M/16)*Cd+(M/8)*Cm1 are the capacitance for a local bit line that is ⅛ of the length of the bit line in FIG. 4a. The last two terms (8*Cd+N*Cm2) are the parasitic capacitance of the unit bit line that has 8 contacts to the bit line switches and a metal 2 bit line. The contact capacitance Cd is much larger than the metal capacitance. The metal 2 capacitance Cm2 is usually smaller than the metal 1 capacitance Cm1. Therefore Equations (1) and (2) show that the bit line parasitic capacitance seen by one sense amplifier of the present invention, Cb, is significantly smaller than Cbp. Smaller bit line capacitance implies faster speed, lower power, and better reliability. There is no need to use complex technology to build the memory cells. It is also possible to increase the size of each memory block to connect more memory cells to each sense amplifier in order to reduce the total area.

The total areas occupied by memory cells are identical between the two memory arrays in FIG. 4a and FIG. 4b. Therefore, the difference in area is completely determined by the layout of peripheral circuits. The available layout pitch for sense amplifiers and for output decoders for the memory in FIG. 4b is 8 times larger than that of the memory in FIG. 4a. It should be obvious to those skilled in the art that a memory of the present invention is smaller than a prior art memory along the dimension vertical to the word line direction due to wider layout pitch. Along the dimension in parallel to word lines, the present invention still needs a decoder 460 of the same layout pitch. In addition, this invention needs to have one set of word line switches 462 for each memory block 452. The additional area occupied by the word line switches 462 does not increase the layout area significantly because we can use smaller high level decoders due to reduction in loading.

Figure 5:
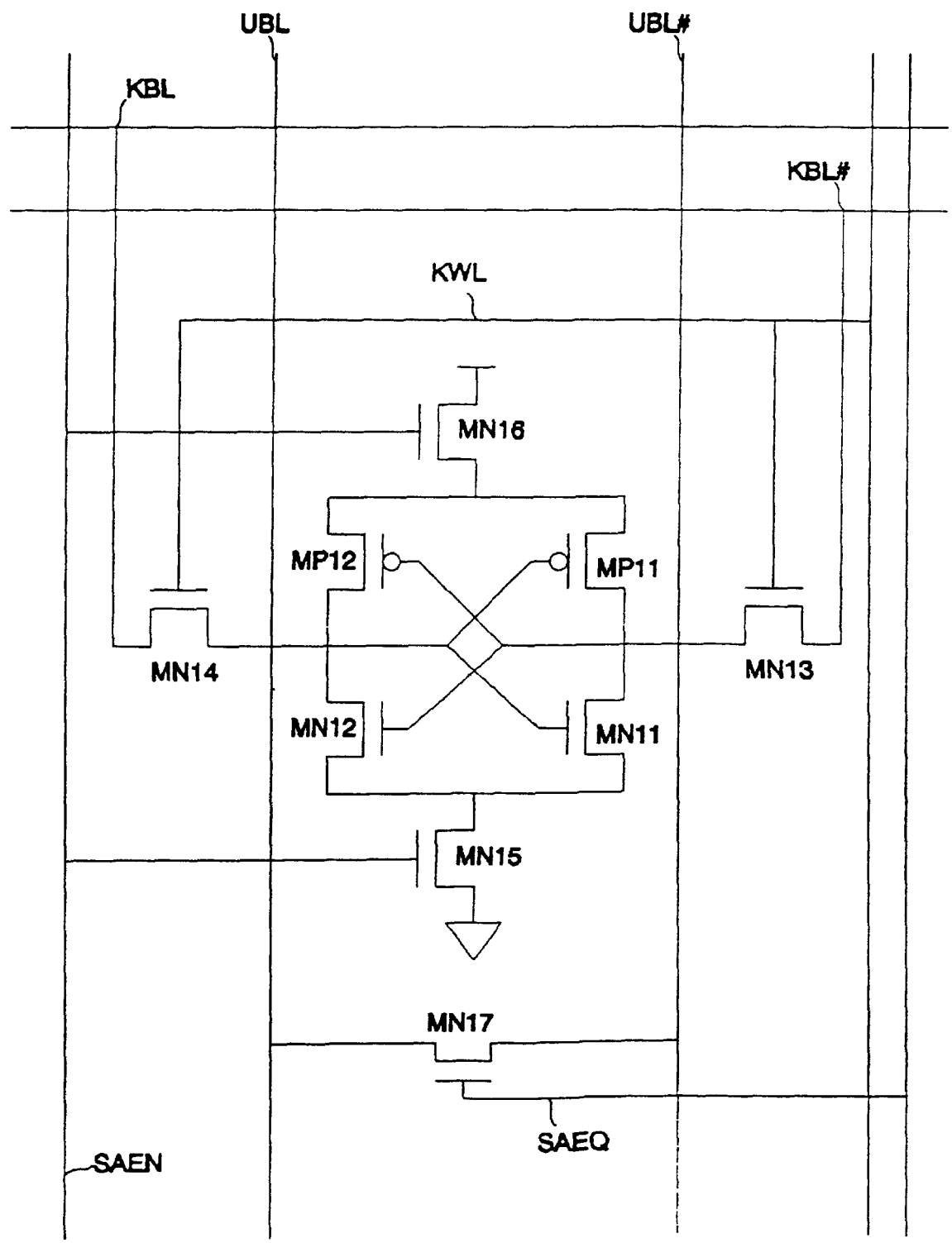
FIG. 5 is a schematic diagram of the sense amplifier used by this invention.

The sense amplifier used in the present invention is substantially the same as typical sense amplifiers used in the prior art. FIG. 5 shows schematic diagram of the amplifier in FIG. 3a. When the sense amplifier enable signal SAEN is activated, transistors MP11, MP12, MN11, and MN12 form a small signal sensing circuit that can detect minute potential difference on the unit bit line pairs UBL and UBL#. The transfer gate transistor MN14 transfers the signal between the unit level bit line UBL and the bank level bit line KBL when the bank level word line KWL is active. The transfer gate transistor MN13 transfers the signal between the unit level bit line UBL# and the bank level bit line KBL# when the bank level word line KWL is active. MN17 is used to equalize the voltages on UBL and UBL# when the sense amplifier is not active. The operation principles of the above sense smplifiers are well known to the art of memory design so we do not describe them in further details.

Figure 6:
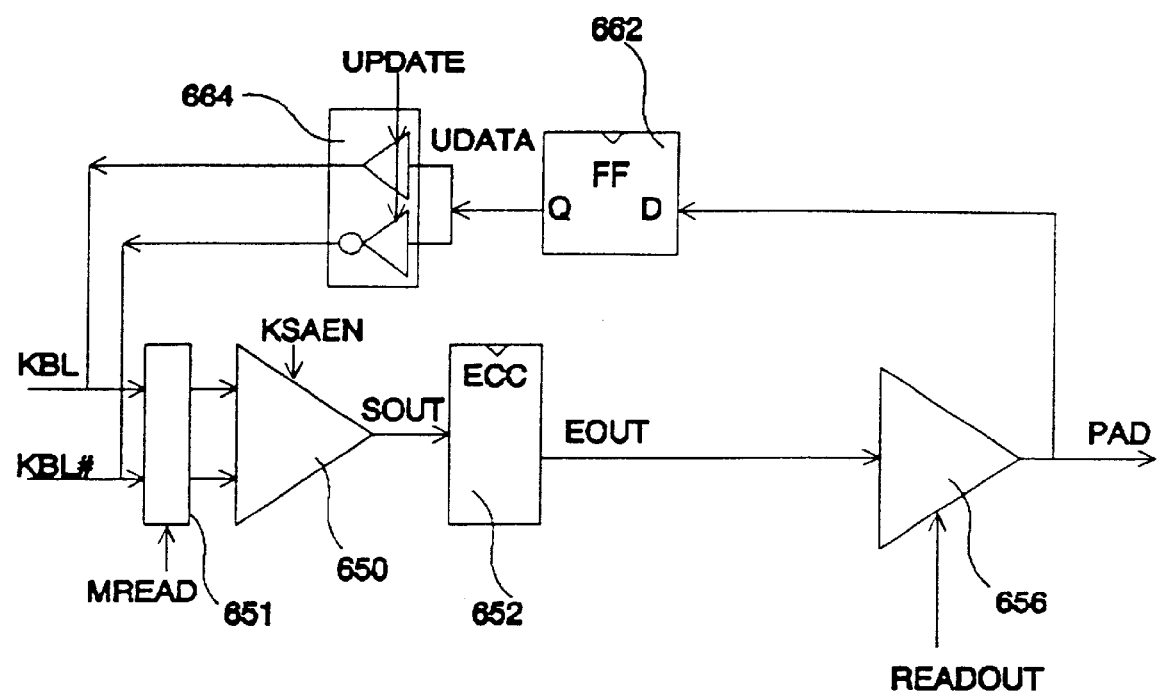
FIG. 6 is a schematic diagram of the IO circuits of the present invention.

FIG. 6 is a block diagram of the IO unit 470 in FIG. 4b. The bank level bit line pair KBL and KBL# are connected to a bank level sense amplifier 650 through a bank level bit line switch 651. This sense amplifier 650 is identical to the sense amplifier in FIG. 5; its enable signal is KSAEN. The KBL switch 651 is rendered conductive when its enable signal MREAD is active, and it isolates the bit lines from the sense amplifier when MREAD is not active. This bit line switch 651 is used to improve the speed of the sense amplifier as well known to the art of memory design. The output of the sense amplifier, SOUT, is connected to an Error-Correction-Code (ECC) circuit 652. The ECC circuit is well known to the art, so we do not discuss it in further details. The output of the ECC circuit, EOUT, is connected to the input of an output driver 665. The output driver 665 drives the data to external pad when it is enabled by the signal READOUT. For a write operation, we place the data on the pad into a storage register 662. The output of the storage register, UDATA, is connected to a memory write driver 664. The memory write driver 664 is controlled by the UPDATE signal to drive data on KBL and KBL# during a memory update operation.

FIGS. 7(a–c) show the waveforms of critical signals for the memory described in previous sections.

FIG. 7a shows the timing of critical signals during a memory operation to read data from memory cells (called a "read cycle"). First, the block select signal BLKSEL is activated at time T1. BLKSEL is active when both XBLK-SEL and YBLKSEL are active. Whenever BLKSEL is active, the precharge circuit of the selected memory block is turned off, so does the precharge circuit of all the sense amplifiers of the selected memory unit. The precharge signal and bank level block select signals XBLKSEL, YBLKSEL are not shown in waveforms because the information is redundant with respect to BLKSEL signal. After BLKSEL is active, block word line WL is active at time T2. Once WL is active, a minute potential difference starts to develop in block bit line pair BL, BL# as well as unit bit line pair UBL, UBL#. After enough potential difference has developed on the unit bit line pairs, the sense amplifiers of the selected memory unit are activated by bring SAVCC to VCC, and SAVSS to VSS. The unit sense amplifier starts to magnify the bit line potential once it is activated at T3. The bank level word line KWL is then activated at T4; the potential differences in UBL and UBL# are transferred to bank bit line pairs KBL and KBL# once KWL is activated. Between time T4 and T5, the voltages of UBL and UBL# are first drawn toward PCGV due to charge sharing effect between bank bit lines and unit bit lines; the unit sense amplifier eventually will overcome the charge sharing effect and magnify their potential difference. At time T5, the bank-word-line KWL is off, and the pulling of KSAVCC to VCC and KSAVSS to VSS activates the bank level sense amplifier 750. The bank level sense amplifier 750 will magnify the potential difference on KBL and KBL# to full power supply voltages. In the mean time, the unit level sense amplifier will also pull UBL and UBL# to full power supply voltage. Because we are relying on the unit level sense amplifier to refresh the selected memory cells, we need to provide a timing margin to make sure the signal charges in those memory cells are fully restored before we can turn off the word line WL at T6. After the word line is off, sense amplifiers are deactivated at T7, then the block select signal BLKSEL is deactivated at T8. Once BLKSEL is off, the memory is set into precharge state, and all bit line voltages return to PCGV. A memory of this invention has much shorter precharge time than prior art memories due to much lower loading on each level of its bit lines. At time T9, all signals are fully restored to their precharge states, and the memory is ready for next memory operation.

FIG. 7b shows the timing of critical signals for a memory operation to refresh the data of memory cells (called a "refresh cycle"). A refresh cycle is very similar to a read cycle except that we do not need to bring the data to bank level. All these bank level signals, KWL, KSAVCC, KSAVSS, KBL, and KBL# remain inactive throughout a refresh cycle. At time T11, the block select signal BLKSEL is active, then the word line WL is activated at time T12. Potential differences start to develop in block level and unit level bit lines BL, BL#, UBL, and UBL#. At time T13 the sense amplifier is activated. The sense amplifier quickly magnify and drive the bit lines to full power supply voltages. When the charges in selected memory cells are fully restored, we can turn off the word line WL at T14, then turn off block select signal BLKSEL at T15. At time T16, all the signals are restored into precharge states, and the memory is ready for next operation. Comparing FIG. 7b with FIG. 7a, it is obvious that the time need for a fresh cycle is shorter than the time for a read cycle because we do not need to drive KBL and KBL#.

FIG. 7c shows the timing of critical signals during a memory operation to write new data into memory cells (called a "write cycle"). At time T21, the block-select-signal BLKSEL and bank level word line KWL are activated. In the mean time, the new data is written into the bank level bit lines KBL and KBL#, then propagate into lower level bit lines UBL, UBL#, BL, and BL#. The memory write driver 764 has strong driving capability so that bit lines can be driven to desired values quickly. At time T22, the unit level sense amplifier is activated to assist the write operation. Once the charges in the memory cells are fully updated, the word lines WL and KWL are turned off at T23. Then, the block select signal BLKSEL are off at T24. At T25 the memory is fully restored to precharge state ready for next memory operation. Comparing FIG. 7c with FIG. 7a, it is obvious that the time needed to execute a write cycle is much shorter than the time needed to execute a read cycle because of the strong driving capability of the memory write driver 764.

As illustrated by FIG. 7a, the reason why read operation is slower than write or refresh operations is because the read operation cannot be finished until the unit level sense amplifiers fully restore the signal charges in the selected memory cells. From the point of view of an external user, the additional time required to refresh the memory does not influence the total latency for a memory read operation because the process to deliver data from bank level circuit to external pad is executed in parallel. The refresh time is therefore "hidden" from external users. The only time an external user can feel the effect of this additional refresh time is when a refresh cycle is scheduled at the same time as a read cycle is requested. The memory can not execute a refresh cycle in parallel to a read cycle at a different address, so one of the requests must wait. External control logic is therefore necessary to handle this resource conflict condition. For a memory with ECC support, data write operations always need to start with memory read operations, so the above problems also apply to memory write operations. In order to fully compatible with an SRAM, we must make internal memory refresh cycles completely invisible to external users. This is achieved by simple changes in IO circuit shown in FIG. 8, and change in timing control shown in FIG. 9.

Figure 8:
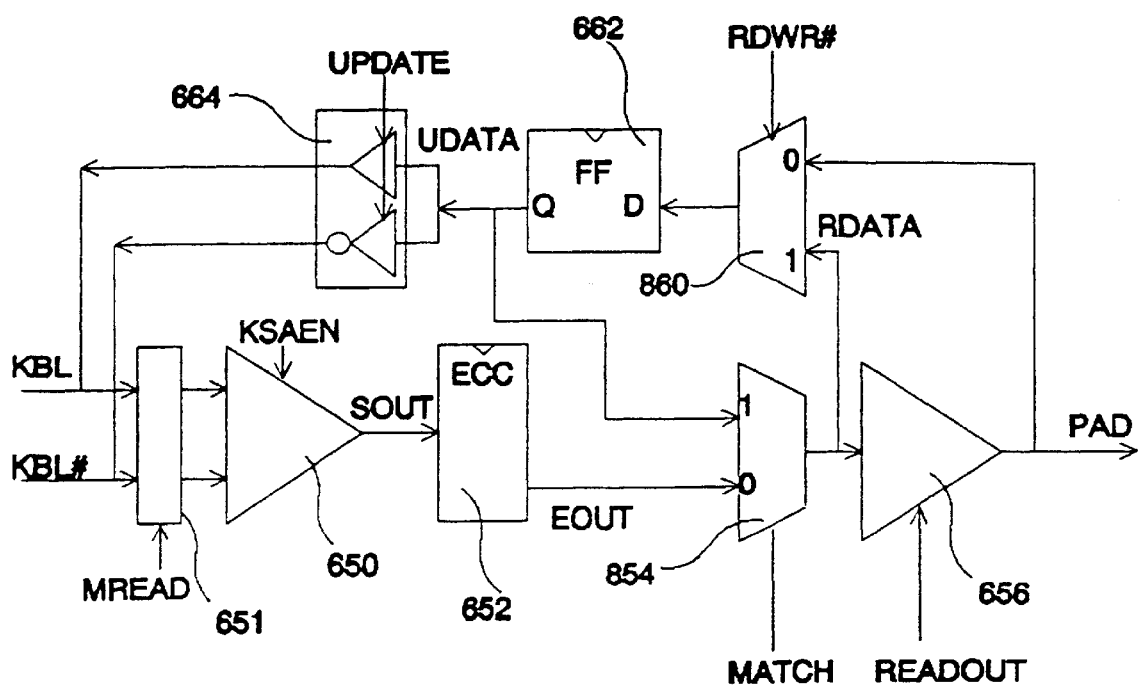
FIG. 8 is a schematic diagram of the IO circuits of the present invention to support faster data read.

The IO circuit in FIG. 8 is almost identical to the IO circuit in FIG. 6 except that it has two additional multiplexers 854, 860. The output of the ECC circuit, EOUT, is connected to the input of a bypass multiplexer 854. During a read cycle, the bypass multiplexer 854 selects the output from the storage register 662 if the reading memory address matches the address of the data stored in the storage register 662. Otherwise, the bypass multiplexer 854 selects the output of the ECC circuit, and sends the memory output to the output driver 665. The storage multiplexer 860 selects the input from external pad during a write operation, and it selects the data from memory read out during a read operation. This architecture allows us to "hide" a refresh cycle in parallel with a normal memory operation. It also improves the speed of normal read operations. Using the circuit in FIG. 8, the most updated data of previous memory operation are always stored into the storage register 662. To execute a new memory operation, we always check if the data are stored in the storage register before reading data from the memory array. If the wanted data is already stored in the storage register, no memory operation will be executed, and the data is read from the storage register directly. When a new set of data is read from the memory array, an update cycle is always executed before the end of a new memory operation to write the data currently in the storage buffer back into the memory array. Since we always store every memory read results into the storage registers, there is no need to refresh the selected memory cells immediately. With this configuration, we can terminate the read operation before the unit level sense amplifier can fully refresh the activated memory cells. Therefore, the unit level circuits are available for a refresh cycle at the same time when the memory is propagating the read data to the external pads. This architecture removes the conflict between refresh cycle and normal memory operations. The operation principle of this scheme is further illustrated by the waveforms in FIG. 9.

Figure 9:
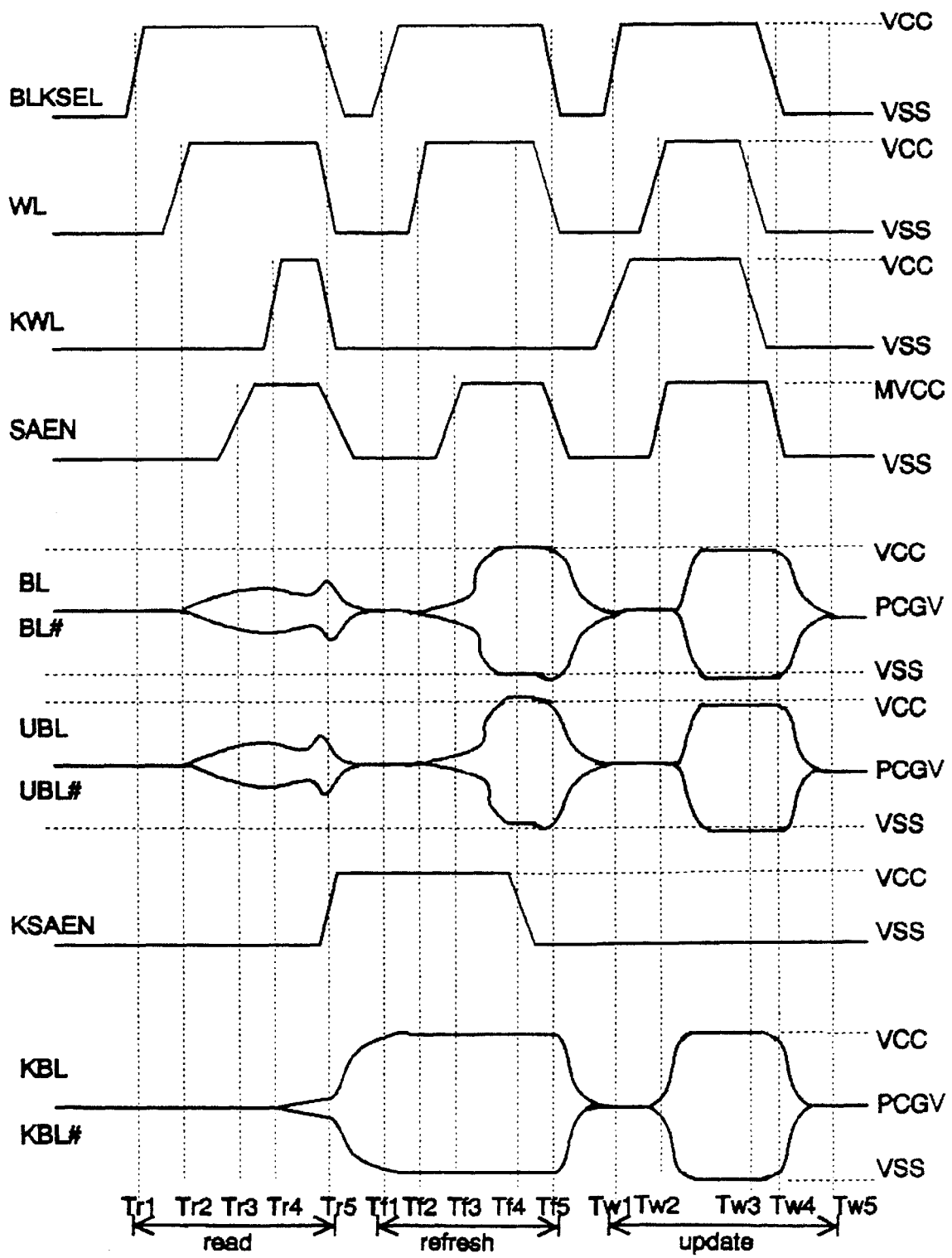
FIG. 9 shows the timing relationship of critical signals of a memory device of this invention.

FIG. 9 shows the worst case situation when a memory operation overlaps with a refresh operation (to a different address or to the same memory block), and when there is a need to update data from the storage buffer at the same time. Under this worst case condition, the refresh cycle and the memory update cycle must be "hidden" in the memory read operation in order to avoid complexity in system support. On the other word, we must execute the refresh and update cycles in parallel without influencing the timing observable by an external user.

At time Tr1 in FIG. 9, the block select signal BLKSEL is activated for a read operation. At time Tr2, the word line WL is activated, then the unit sense amplifier is activated at Tr3. The unit level word line KWL is activated at Tr4, and the unit level sense amplifier is activated at time Tr5. Until time Tr5, the memory operations and waveforms are identical to those shown in the read cycle in FIG. 8a. The operation is different starting at Tr5; we are allowed to turn off the block select signal BLKSEL, the word lines WL, KWL, and the unit level sense amplifier simultaneously at Tr5 without waiting for full amplification of the memory data. The memory block quickly recovers to precharge state ready for next operation at time Tf1. During this time period, the unit level sense amplifier does not have enough time to fully amplify the signals in the lower level bit lines BL, BL#, UBL, and UBL#. Those activated memory cells no longer stores the original data. That is perfectly all right because the correct data will be stored in the storage register 662 in the following procedures. At time Tf1, the data are sensed by the bank level sense amplifier; the correct data will be remembered in the storage register 662 and updated into those selected memory in the next memory operation. Therefore, the data are not lost even when the storage charge in the memory cells are neutralized at this time. At the same time when we are waiting for the bank level circuits to propagate the new read data to external circuits, the unit level and block level memory circuits are available for a refresh operation. This hidden refresh cycle can happen at any memory address. The worst case timing happen when the refresh cycle happens at the same block that we just read. FIG. 9 shows the timing of the worst case condition. At time Tf1, BLKSEL is activated for the refresh cycle. A refresh cycle with identical waveforms as the waveforms in FIG. 8b is executed from time Tf1 to time Tf5. At time Tw1, the memory unit is ready for new operation, and the bank level read operation is completed. At this time, the IO unit 720 is executing ECC correction and the data is propagating to the pads. In the mean time, the bank level resources are available, so we take this chance to update the old data in the storage register 762 back into the memory array by executing a write cycle. The waveforms in FIG. 9 from time Tw1 to Tw5 are identical to the waveforms in FIG. 7c. At the end of the memory operation, the latest data just read from the memory are stored into the storage register 662, the previous data are updated into the memory array, we fulfilled a refresh request, and the external memory operation request is completed.

It is still true that we need to record the data stored in every activated memory cell. Otherwise the data will be lost. The difference between the above memory access procedures and conventional DRAM and EPROM memory accesses is that the data is temporarily stored in the storage registers so that we do not need to refresh the activated memory cells immediately. This architecture delays data update until next memory process using available bandwidth, so that refresh cycles and update cycles can be hidden to improve system performance.

The above architecture is different from a hybrid memory because (1) this invention simplifies the timing control of DRAM read cycle while the SRAM of the hybrid memory does not simplify the DRAM operation, (2)the system control and device performance of the present invention is the same no matter the memory operation hits the storage register or not, while the performance and control of a cache memory is significantly different when the memory operation miss the cache array, (3)a hybrid memory has better performance when the size of the SRAM cache is larger due to higher hit rate, while the performance of the present invention is independent of hit rate, and (4)the storage register does not introduce significant area penalty while the on-chip SRAM of hybrid memory occupies a significant layout area. The structure and the operation principles of the memory architecture described in the above sections are therefore completely different from the structures of hybrid memories.

As apparent from the foregoing, the following advantages may be obtained according to this invention.

(1) The tight pitch layout problem is solved completely. Since many bit line pairs share the same sense amplifier, the available layout pitch for each peripheral circuit is many times of the memory cell pitch. Therefore, sense amplifiers and peripheral circuits of high sensitivity with electrical symmetry and high layout efficiency can be realized.

(2) The bit line loading seen by the sense amplifier is reduced dramatically. It is therefore possible to improve the performance significantly.

(3) It is also possible to attach a large number of memory cells to each sense amplifier to reduce total device area.

(4) The novel design in decoder reduces decoder size significantly without sacrificing driving capability. The loading on each unit word line is also reduced significantly. This decoder design reduces layout area and improves device performance.

(5) Changes in memory access procedures allow us to delay the refresh operation until next memory operation. Internal refresh operations are therefore invisible for external users.

(6) The only devices activated in each memory operation are those devices must be activated. There is little waste in power. The present invention consumes much less power than prior art memories.

A memory device of the present invention is under production. Using 0.6 micron technology to build a memory array containing one million memory cells, we are able to achieve 4 ns access time, which is more than 10 times faster then existing memories devices of the same storage capacity.

Figure 10:
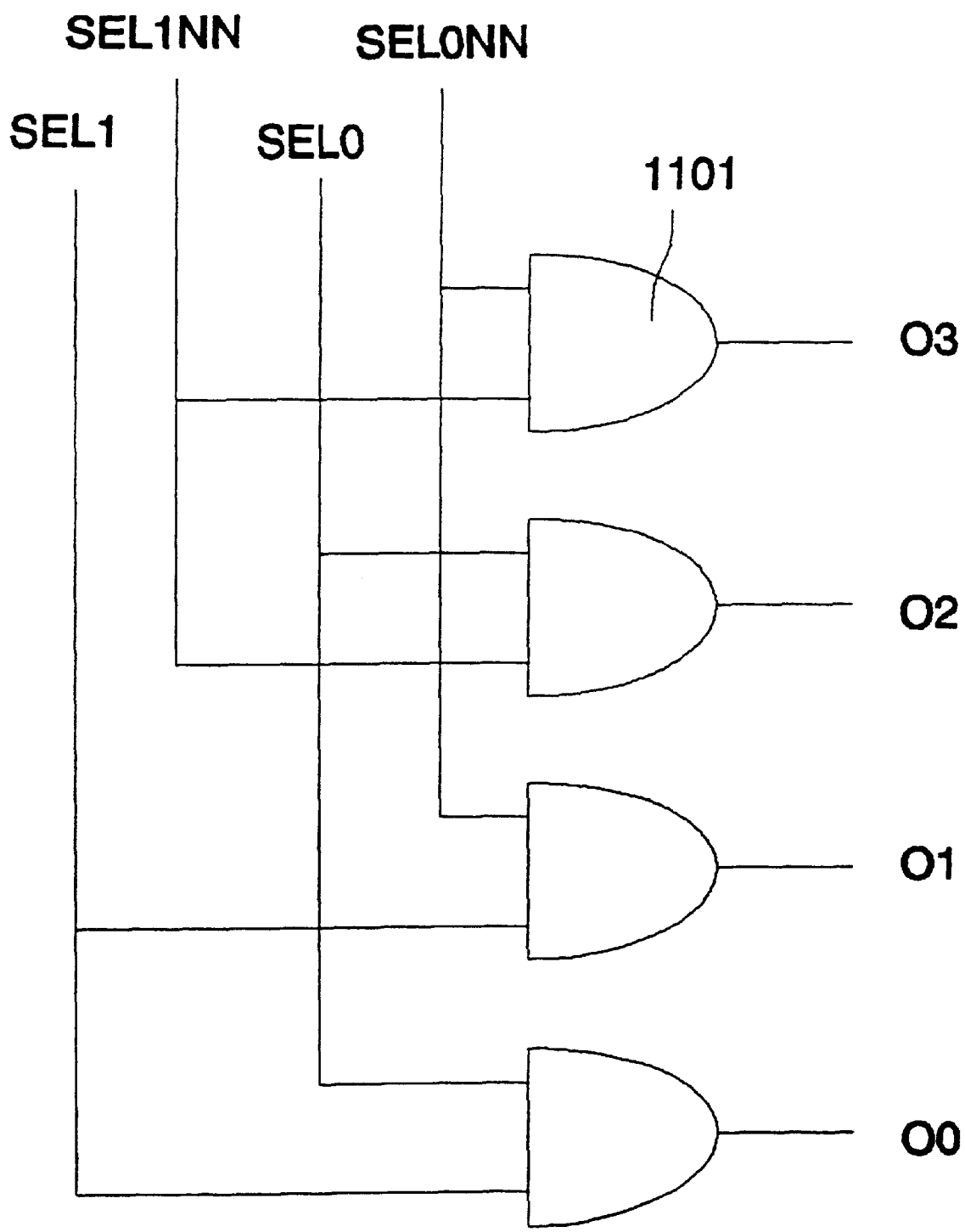
FIG. 10 shows an example of a prior art CMOS decoder.

FIG. 10 shows an example of a typical prior art decoder. Each branch of the decoder contains one AND gate 1101 that controls one of the outputs of the decoder O3-0. Two sets of mutually exclusive input select signals (G0, G0NN) and (G1, G1NN) are connected to the inputs of those AND gates as show in FIG. 10, so that no more than one output O3-0 of the decoder can be activated at any time.

Figure 11A:
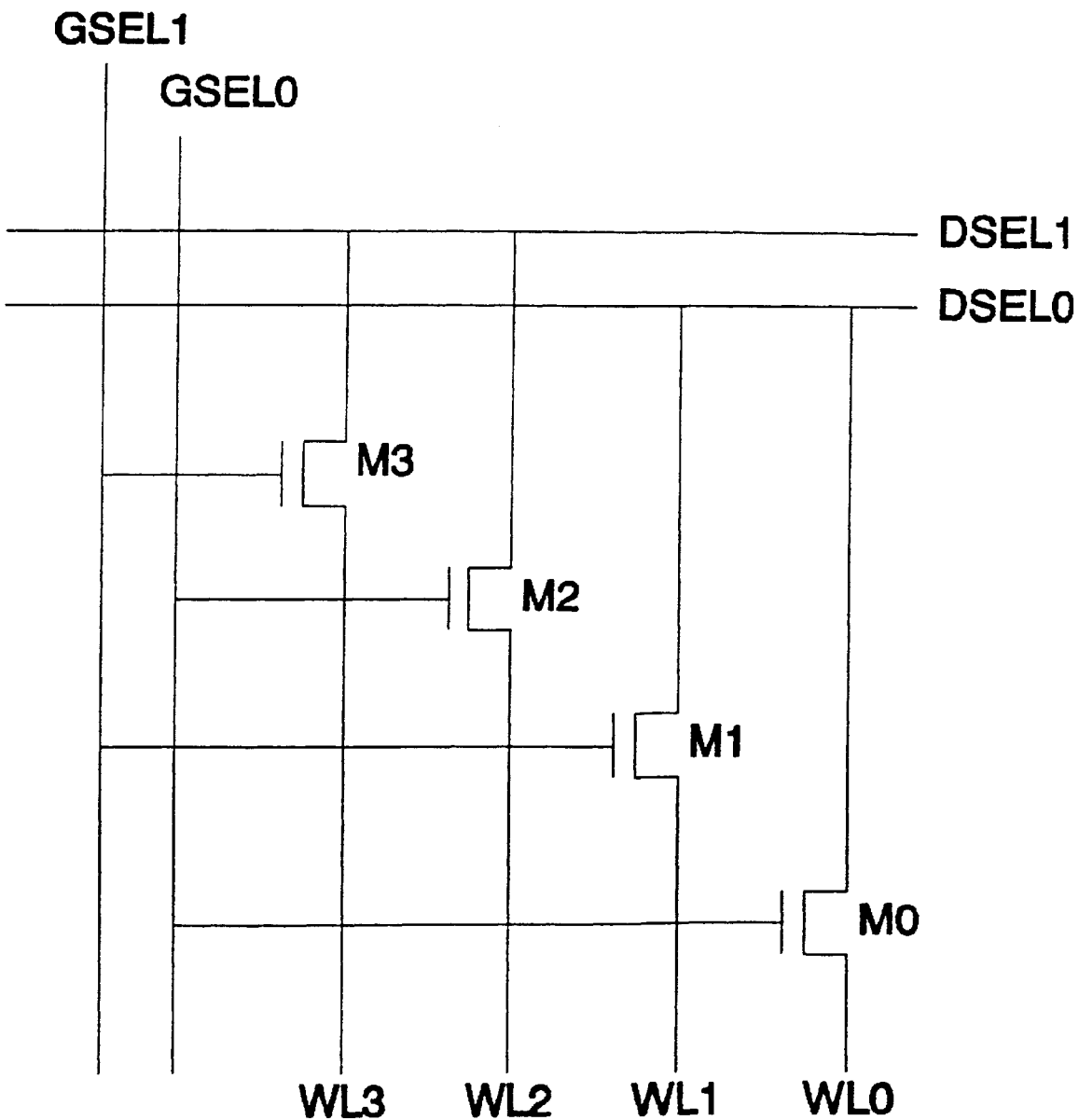
FIG. 11(a) is a schematic diagram of an enhance mode single transistor decoder of the present invention.

FIG. 11(a) is the schematic diagram of a single-transistor decoder that uses only one n-channel transistor M3 to M0 for each branch of the decoder. The source of each transistor M3 to M0 is connected to one word line WL3 to WL0 of the memory array. A set of mutually exclusive drain select signals DSEL1, DSEL0 are connected to the drains of those transistors M3 to M0, and a set of mutually exclusive gate select signals GSEL1 and GSEL0 are connected to the gates of those transistors M3 to M0, as shown in FIG. 11(a). In this configuration, WL3 is activated only when both DSEL1 and GSEL1 are activated, WL2 is activated only when both DSEL1 and GSEL0 are activated, WL1 is activated only when both DSEL0 and GSEL1 are activated, and WL0 is activated only when both DSEL0 and GSEL0 are activated. Therefore, the circuit in FIG. 11(a) fulfills the necessary function of a memory word line decoder. A typical CMOS AND gate contains 3 p-channel transistors and 3 n-channel transistors. The decoder in FIG. 12(a) uses only one transistor for each output of the decoder. It is apparent that the decoder in FIG. 11(a) is by far smaller than the one in FIG. 10. However, the single-transistor decoder in FIG. 11(a) requires special timing controls as illustrated in the following example.

FIG. 11(b) illustrates the timing of input signals to activate one of the word line WL0. Before time T0, there are no decoding activities. All gate select signals GSEL1, GSEL0 must stay at power supply voltage Vcc, and all drain select signals DSEL1, DSEL0 must stay at ground voltage Vss. Otherwise one of the word line maybe activated accidentally by noise or leakage. To activate one word line WL0, we must deactivate all gate select signals GSEL1, GSEL0 at time T0, then activate one of the gate select signal GSEL0 and one of the drain select signal DSEL0 at T1. In order to deactivate the decoder, DSEL0 must be deactivated at time T2 before all gate select signals GSEL1 and GSEL0 are activated again at T3. The above control sequence is necessary to prevent accidental activation of word lines that are not selected. The above timing control sequence is complex because all inputs are involved when we only want to active one word line. The above decoders are simplified examples of 4 output decoders. A realistic memory decoder will need to control thousands of word lines. The power consumed by such complex control sequences can be significant for a realistic memory decoder. Another problem for the decoder in FIG. 11(a) is also illustrated in FIG. 11(b). Due to body effect of n-channel transistor M0, the voltage of the activated word line WL0 is lower than the power supply voltage Vcc by an amount Vbd as shown in FIG. 11(b). This voltage drop can be a big problem for a DRAM decoder because it will reduce the signal charge stored in DRAM memory cells.

Figure 12A:
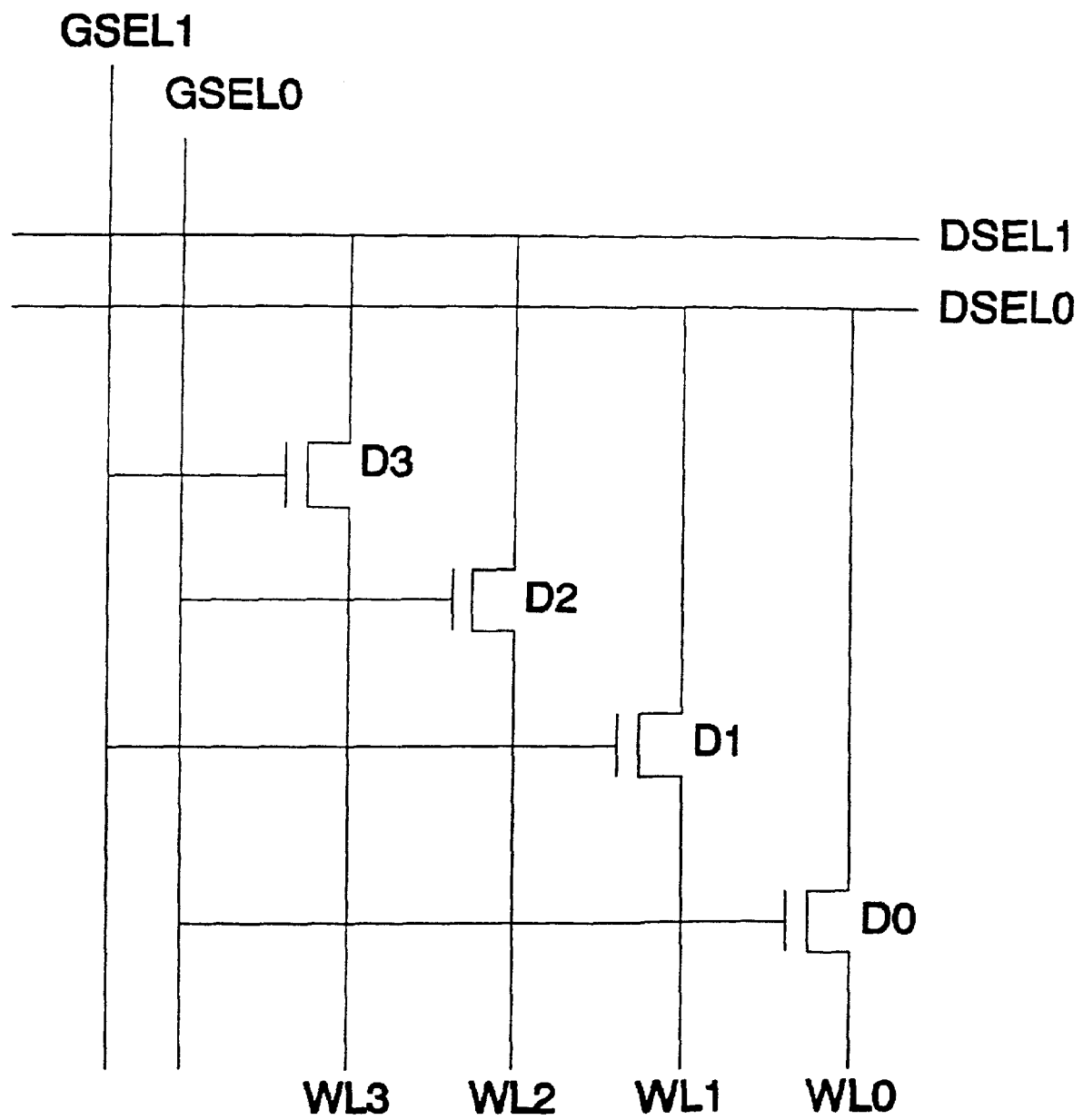
FIG. 12(a) is a schematic diagram of a depletion mode single transistor decoder of the present invention.

FIG. 12(a) is a schematic diagram of a decoder of the present invention. The only differences between the decoders in FIGS. 11(a), 12(a) is that depletion mode transistors D3 to D0, instead of enhanced mode transistors M3 to M0, are used by the decoder shown in FIG. 12(a). The threshold voltage of those depletion mode transistors D3 to D0 is controlled to be around −0.2 volts (or roughly ⅓ of the threshold voltage of a typical enhance mode transistor) below power supply voltage Vcc.

Figure 12C:
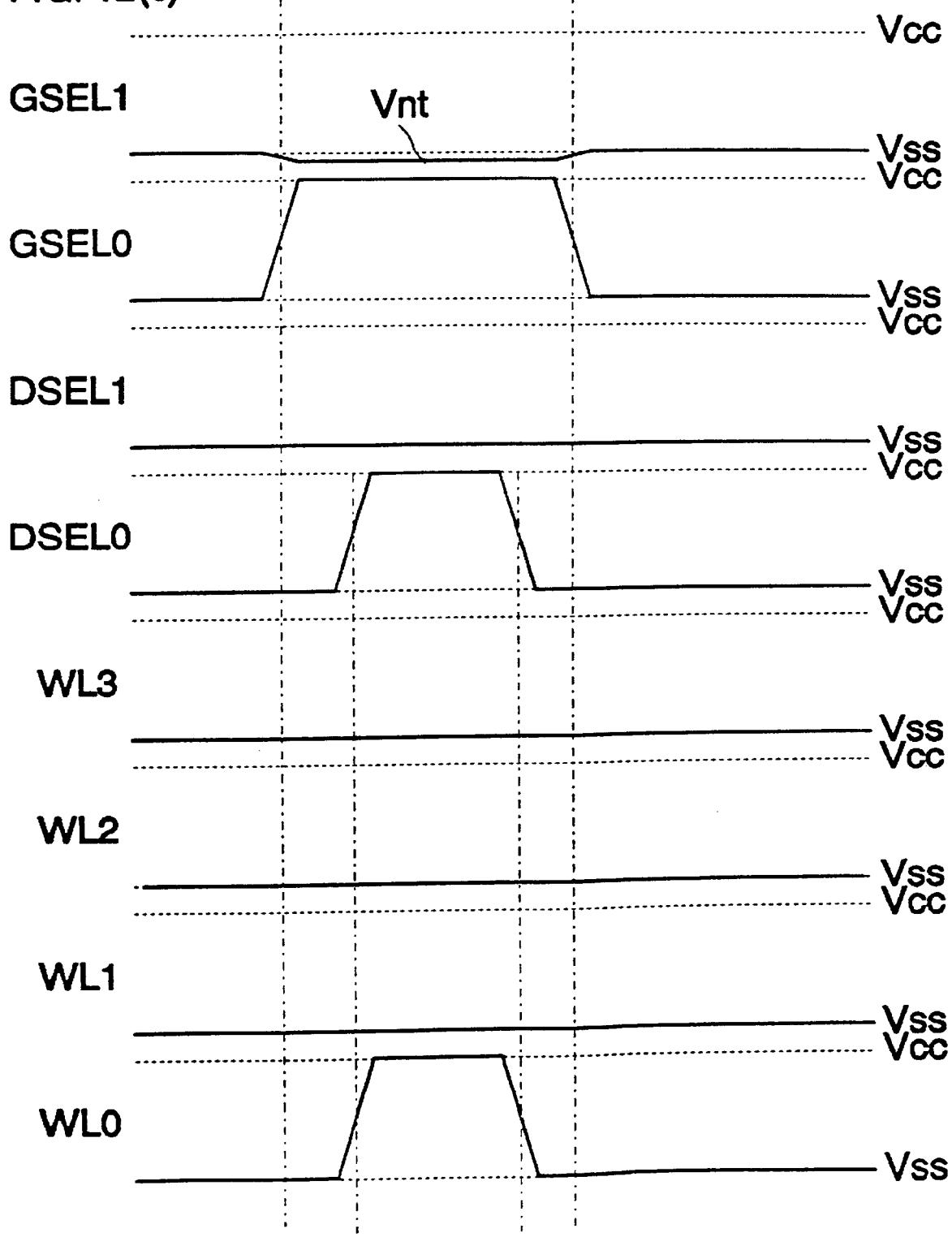

FIG. 12(b) illustrates the timing of input signals to select one word line WL0 of the depletion-mode single transistor decoder in FIG. 12(a). Before time T0, all the gate select singles GSEL1, GSEL0, and all the drain select signals DSEL1, DSEL0 are at ground voltag. Unlike the enhance mode single transistor decoder in FIG. 11(a), it is all right to set the gate control signals GSEL1, GSEL0 at Vss when the decoder is idle. The word lines WL3-WL0 won't be activated by noise or small leakage because the depletion-mode transistors D3 to D0 are partially on when its gate voltage is at Vss. To activate one word line WL0, we no longer need to deactivate all gate select signals. We only need to activate one gate select signal GSEL0 and one drain select signal DSEL0 as shown in FIG. 12(b). To deactivate the decoder, we can simply deactivate GSEL0 and DSEL0 as shown in FIG. 12(b). This control sequence is apparently much simpler than the control sequence shown in FIG. 11(b). There is also no voltage drop cause by body effect on the selected word line because the threshold voltage of the activated transistor M0 is below zero. The depletion mode single transistor decoder in FIG. 12(a) is equally small in area as the enhance mode single transistor decoder in FIG. 11(a), but it will consume much less power. The only problem is that some of those word lines are partially activated when they have deactivated gate select signal but activated drain select signal as illustrated by WL1 in FIG. 12(b). This partial activation of word lines is not a functional problem when the voltage Vpt is less than the threshold voltage of selection gates in the memory cells, but it may introduce a potential charge retention problem due to sub-threshold leakage current. One solution for this problem is to introduce a small negative voltage on all deactivated gate select signals at time T0 as shown in FIG. 12(c). This small negative voltage Vnt on the drain select signal assures the depletion gate transistor D1 remains unconductive so that the word line WL1 won't be partially activated.

While specific embodiments of single transistor decoders have been illustrated and described herein, it is realized that other modifications and changes will occur to those skilled in the art. For example, p-channel transistors or depletion mode p-channel transistors can replace the n-channel transistors in the above examples.

As apparent from the foregoing, single-transistor-decoders of the present invention occupy much small area than the prior art CMOS-decoders. It is therefore possible to divide a large memory array into small block-each block isolated by its own decoder-without increasing the total area significantly. When the memory array is divided into small blocks, we no longer need to have large storage capacitor as prior art EPROM cells have. It is therefore possible to build DRAM and EPROM memory cells using standard logic technology.

Figure 13A:
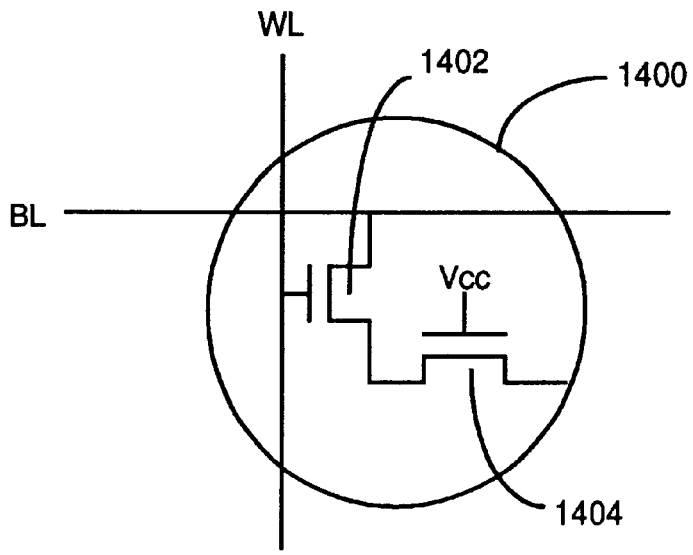
FIG. 13A is a schematic diagram of a memory cell that uses an active transistor device as the storage capacitor of the memory cell.
Figure 13B:
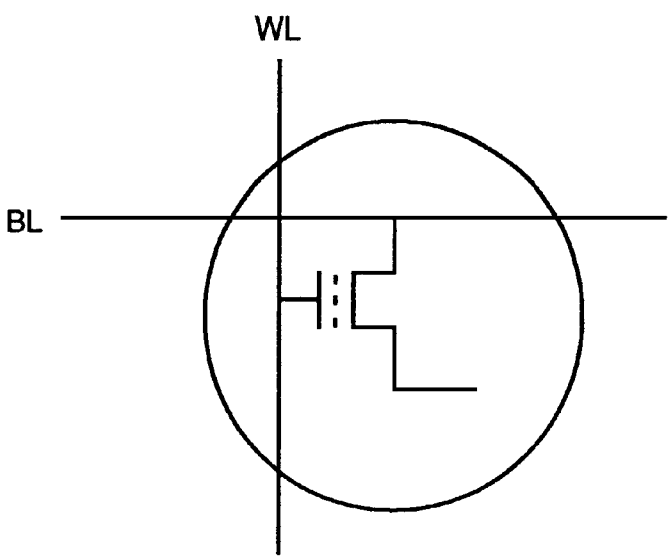
FIG. 13B is a schematic diagram of an EPROM memory cell connected at the intersection between a wordline and a bitline of FIG. 3.
Figure 14A:
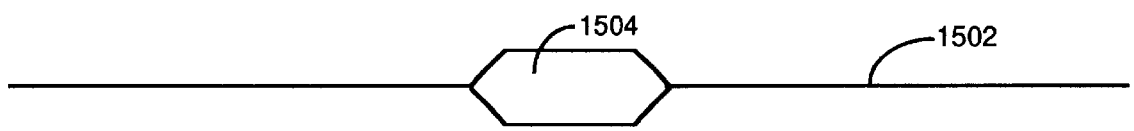
FIGS. 14(a–g) are cross-section diagrams describing the process step to manufacture a DRAM memory cell by adding one masking step to standard logic technology.
Figure 14B:
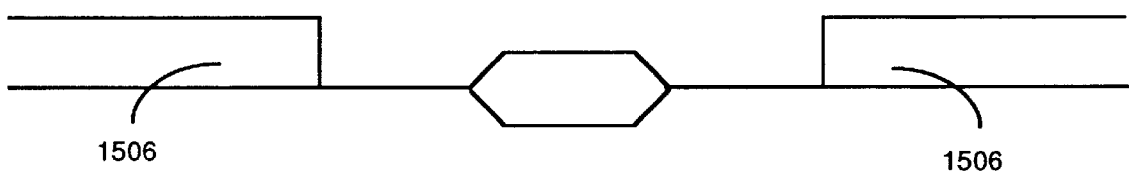
Figure 14C:
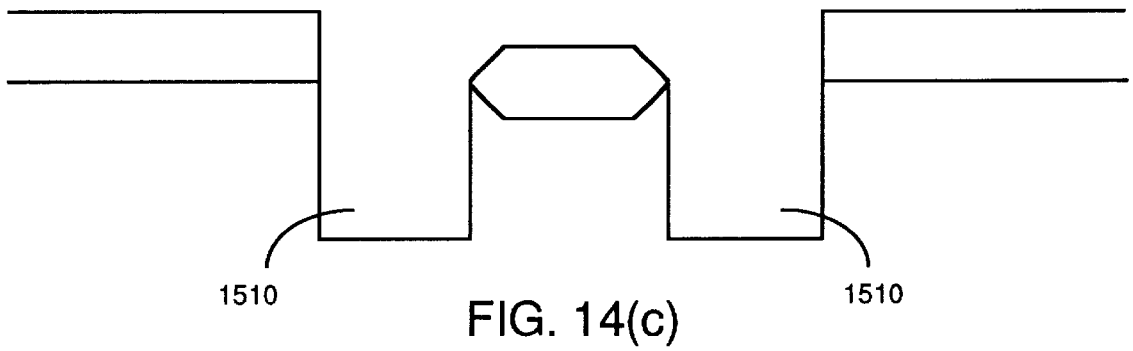
Figure 14D:
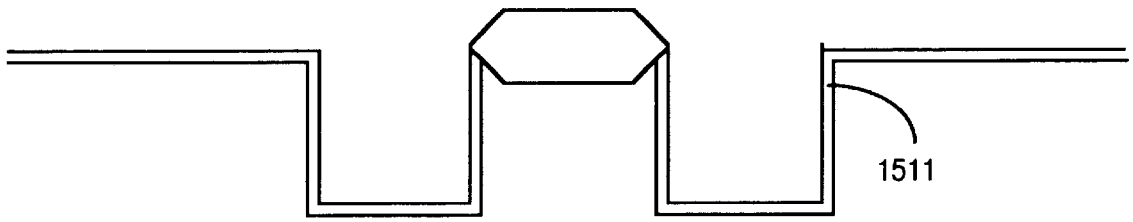
Figure 14E:
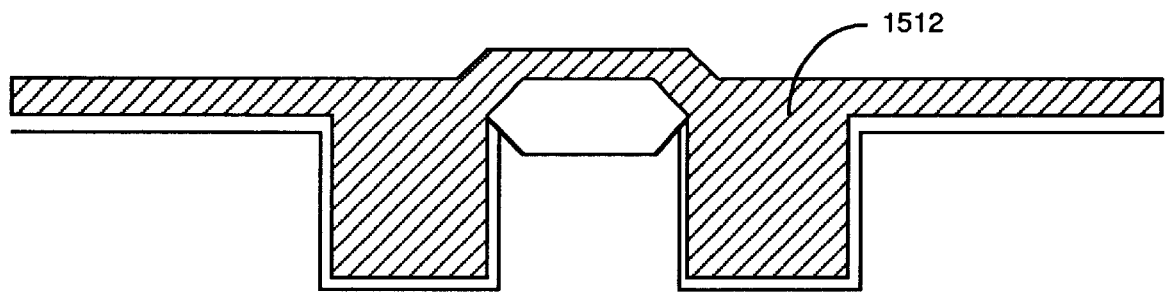
Figure 14F:
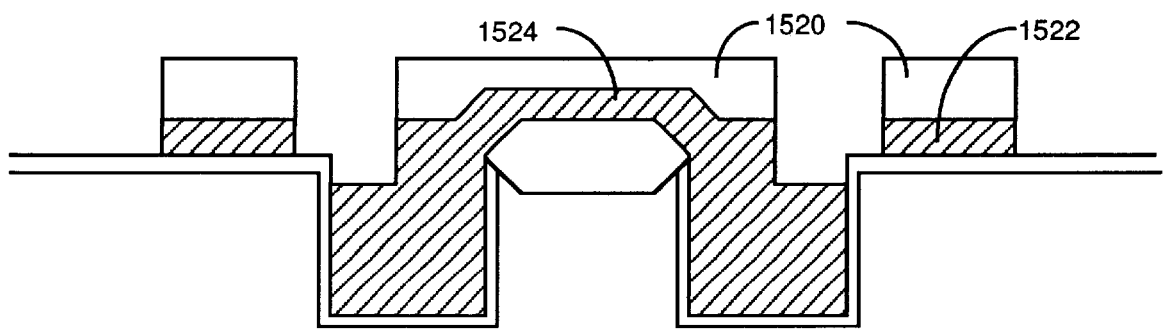
Figure 14G:
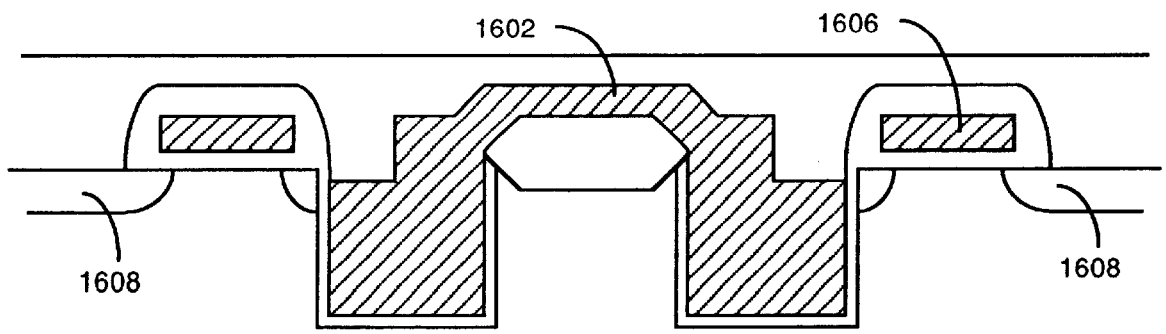

One example of DRAM memory cell built by logic technology is shown in FIG. 13A. This memory cell 1400 contains one select transistor 1402 and one storage transistor 1404. The gate of the storage transistor 1404 is biased to full power supply voltage Vcc so that it behaves as a capacitor. The drain of the storage transistor 1404 is connected to the source of the select transistor 1402. The gate of the select transistor 1402 is connected to word line WL, and the drain of the select transistor is connected to bit line BL. Using this memory cell 1400 and a memory architecture disclosed in this invention and in our previous patent application, commercial memory products were manufactured successfully. The major advantage of the logic memory cell 1400 is that it can be manufactured using standard logic technology. The resulting memory product achieved unprecedented high performance. The area of the logic memory cell 1400 is larger than prior art DRAM cells because two transistors, instead of one transistor and one capacitor, are used to build one memory cell. It is therefore desirable to be able to build single transistor memory cell from a manufacture technology as similar to logic technology as possible. FIG. 13B shows an EPROM memory cell connected to a wordline and bitline to form a memory array configured as an memory array with multiple-dimensional first level bitline as that shown in FIG. 3.

Therefore, according to FIGS. 3a to 4b, and FIGS. 12(a) to 13, a semiconductor memory device 300 is disclosed which is provided for operation with a plurality of cell-refreshing sense-amplifiers (SAs). The memory device 300 includes a memory cell array having a plurality of first-direction first-level bit lines, e. g. , bit line BLni in block n for bit-i, along a first bit-line direction, disposed in a parallel manner along a first direction, e. g. , a horizontal direction. The memory cell array further includes a plurality of word lines WL intersected with the first-direction first-level bit lines. The memory cell array further includes a plurality of memory cells. Each of these plurality of memory cells being coupled between one of the first-direction first level bit lines, i. e., bit line BLni in block n for bit-i, along a first bit-line direction and one of the word lines for storing data therein. The memory device further includes a plurality of different-direction first level bit lines, e. g., multiple-block or the unit bit-line-i such as UBLi, BBLi, CBLi, etc. (referring to FIG. 3b), where i=1, 2, 3, . . . I, disposed along a plurality of different directions, e. g., along a vertical direction, with at least one of the different directions being different from the first direction, wherein each of the first direction first level bit lines connected to one of the cell-refreshing sense amplifiers (SAs) directly or via the different-direction first level bit-lines. In a specific preferred embodiment, one of the different directions, e. g., a vertical direction, for arranging the different-direction first level bit lines, e. g., the multiple-block bit-line-i UBLi, BBLi, CBLi, etc. (referring to FIG. 3b). Where i=1, 2, 3, . . . I, being perpendicular to the first direction, e. g., a horizontal direction for arranging the first-direction first level bit lines. In the preferred embodiment as shown in FIG. 4b, the memory device 300 further includes bit line switches connected between the first level bit lines, which are arranged in different directions. The semiconductor memory device further includes a decoder 302 for generating an activating signal for activating one of the word lines WL. The decoder 302 further includes a plurality of drain select lines, e. g., DSEL0 AND DSEL1, etc., each being provided for receiving one of a plurality of mutual exclusively drain select signals. The decoder 302 further includes a plurality of gate select lines, e. g., GSEL0, GSEL1, etc., each being provided for receiving one of a plurality of mutual exclusively gate select signals. The decoder 302 further includes a plurality of transistors, e. g., D0, D1, or M0, M1, etc. Each transistor includes a drain which being connected correspondingly to one of the plurality of drain select input lines, e. g., DSEL0, DSEL1, etc., for receiving one of the mutually exclusive drain select signals therefrom. Each of the transistors further includes a gate which being connected correspondingly to one of the plurality of gate select input lines GSEL0, GSEL1, etc., for receiving one of the mutually exclusive gate select signals therefrom. Each of the plurality of transistors further includes a source, which is connected to an output signal line for providing the activating signal to one of the word lines WL which being contingent upon the mutually exclusive drain select signals DSEL0, DSEL1, etc. And, the mutually exclusive gate select signals GSEL0, GSEL1, etc. In a preferred embodiment, each of the transistors is an enhanced mode transistor, and in another preferred embodiment, each of the transistors is a depletion mode transistor.

Furthermore, according to FIGS. 3a to 4b, and FIGS. 12(a) to 13 a method for configuring a semiconductor memory device for operation with a plurality of cell-refreshing sense-amplifiers (SAs) is also disclosed. The method includes the steps of (a) arranging a plurality of first-direction first-level bit lines in a parallel manner along a first direction; (b) arranging a plurality of word lines for intersecting with the first-direction first-level bit lines; (c) coupling a memory cell between each of the first-direction first level bit lines and one of the word lines for storing data therein; (d) arranging a plurality of different-direction first level bit lines along a plurality of different directions with at least one of the different directions being different from the first direction; (e) connecting each of the first direction first level bit lines to one of the cell-refreshing sense amplifiers (SAs) directly or via the different-direction first level bit-lines; (f) connecting each of the word lines WL to a decoder 302 for receiving an activating signal therefrom for activating one of the word lines WL; (g) forming the decoder with a plurality of transistors each includes a drain, a gate and a source therein; (h) connecting a drain select line to each of the drain of each of the transistors and connecting a gate select line to each of the gate of each of the transistors; (i) applying each of the drain select lines to receive one of a plurality of mutually exclusive drain select signals and each of the gate select lines to receive one of a plurality of mutually exclusive gate select signals; and (j) applying each of the plurality of transistors to generate an output signal from each of the source which being contingent upon the mutually exclusive drain select signals and the mutually exclusive gate select signals for providing the activating signal to each of the word lines.

According to FIG. 13, this invention further discloses an erasable-programmable read-only memory cell, which is coupled to a word-line and a bit-line. The memory cell includes a select transistor 1402 includes a drain connected to the bit line BL and a gate connected to the word line WL. The cell further includes a storage transistor 1404 includes a drain connected to the source of the select transistor 1402 and a gate connected to a power supply voltage Vcc whereby the storage transistor 1404 is implemented as a capacitor for storing a binary bit therein. In summary, the present invention further discloses a memory cell coupled to a word-line and a bit-line. The memory cell includes a storage transistor connected to the word line and bit line via a select means provided for selectively activating the memory cell. And, the storage transistor further includes a gate, which is biased to a power supply voltage to function, as a capacitor for storing a binary bit therein.

This invention further discloses a method for organizing M single-bit erasable programmable read-only memory (EPROM) cells into N blocks, where M is a multiplication-product of N by I by J. and N, I and J are positive integers. The method includes steps of (A) dividing the M single-bit EPROM memory cells into N blocks where each of the block includes {J(j)×I} single-bit memory cells, and where j=1, 2, 3, . . . , N, and the positive integer I representing a bit length of a stored data. (B) arranging the single-bit EPROM memory cells in each of the blocks into a J(j)-by-I two dimensional array and by connecting every I single EPROM memory cells with a first level bit line in a first bit-line direction and every J(j) single-bit EPROM memory cells by a first level word line wherein each the first level word lines and the first level bit lines intersect at one of the single-bit EPROM memory cells. (C) connecting each of the I first level bit lines in each of the blocks to a corresponding multiple-block first level bit-lines, i. e., multiple-block bit-line-i where i=1, 2, 3, . . . 1, wherein the multiple-block first-level bit lines being arranged in a second bit-line direction different from the first-bit line direction and each being connected to a corresponding first level sense-amplifier-i where i=1, 2, 3, . . . I. And, (D) applying a block select signal to activate one of the J(j) first level word lines in one of the blocks, i. e., block-n where n is a positive integer ranging from 1 to N, and employing the I sense amplifiers for detecting memory-cell signals from each of the first level I bit lines of the block n for reading data therefrom whereby the N blocks sharing the I sense amplifiers.

This invention further discloses a memory array unit including M single-bit erasable programmable read-only memory (EPROM) cells organized into N blocks, where M is a multiplication-product of N by I by J, and N, I and J are positive integers. The memory array unit is operated with N first level sense-amplifiers. The unit includes N blocks of EPROM memory array where each of the blocks includes {(j)×I} single-bit EPROM memory cells, and where j=1, 2, 3, . . . N, and the positive integer I representing a bit length of a stored data. Each of the blocks includes a J(j)-by-I two dimensional array and wherein every I single memory cells being connected with a first level bit line along a first bit-line direction and every J(j) single-memory cells are connected by a first level word line wherein each the first level word lines and the first level bit lines intersect at one of the single-bit EPROM memory cells. Each of the I first level bit lines in each of the blocks being connected to a corresponding multiple-block first level bit-lines, i. e. , multiple-block bit-line-i where i=1, 2, 3, . . . I, wherein the multiple-block first-level bit lines being arranged in a second bit-line direction different from the first-bit line direction and each being connected to the corresponding first level sense-amplifier-i where i=1, 2, 3, . . . I. The memory array further includes a block select signal means for activating a block select signal to activate one of the J(j) first level word lines in one of the blocks, i. e. , block-n where n is a positive integer ranging from 1 to N, and wherein the I sense amplifiers being activated for detecting memory-cell signals from each of the first level I bit lines of the block n for reading data therefrom whereby the N blocks sharing the I first level sense amplifiers.

This invention further discloses a semiconductor erasable programmable read-only memory (EPROM) device provided for operation with a plurality of first level sense-amplifiers. The EPROM device includes an EPROM memory cell array having a plurality of first-direction first-level bit lines disposed in a parallel manner along a first direction. The EPROM memory cell array further includes a plurality of word lines intersected with the first-direction first-level bit lines. The EPROM memory cell array further includes a plurality of EPROM memory cells wherein each of the plurality of memory cells being coupled between one of the first-direction first level bit lines and one of the word lines for storing data therein. The EPROM device further includes a plurality of different-direction first level bit lines disposed along at least one different direction different from the first direction, wherein each of the different-direction first level bit lines connected between a plurality of the first-direction first level bit lines and one of the first level sense amplifiers.

Figure 15A:
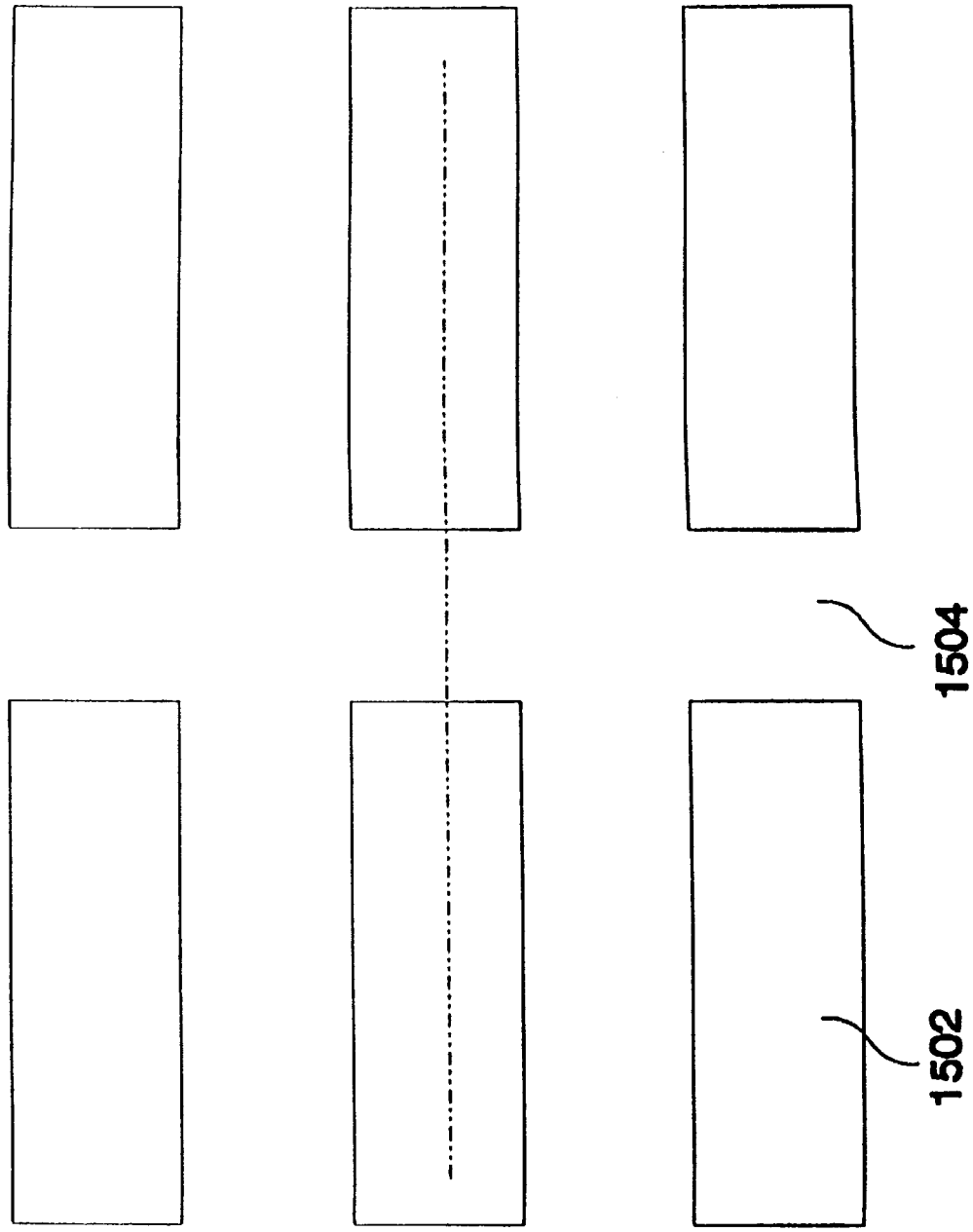
FIGS. 15(a–c) are top views of the process step to manufacture a DRAM memory cell by adding one masking step to standard logic technology.
Figure 15B:
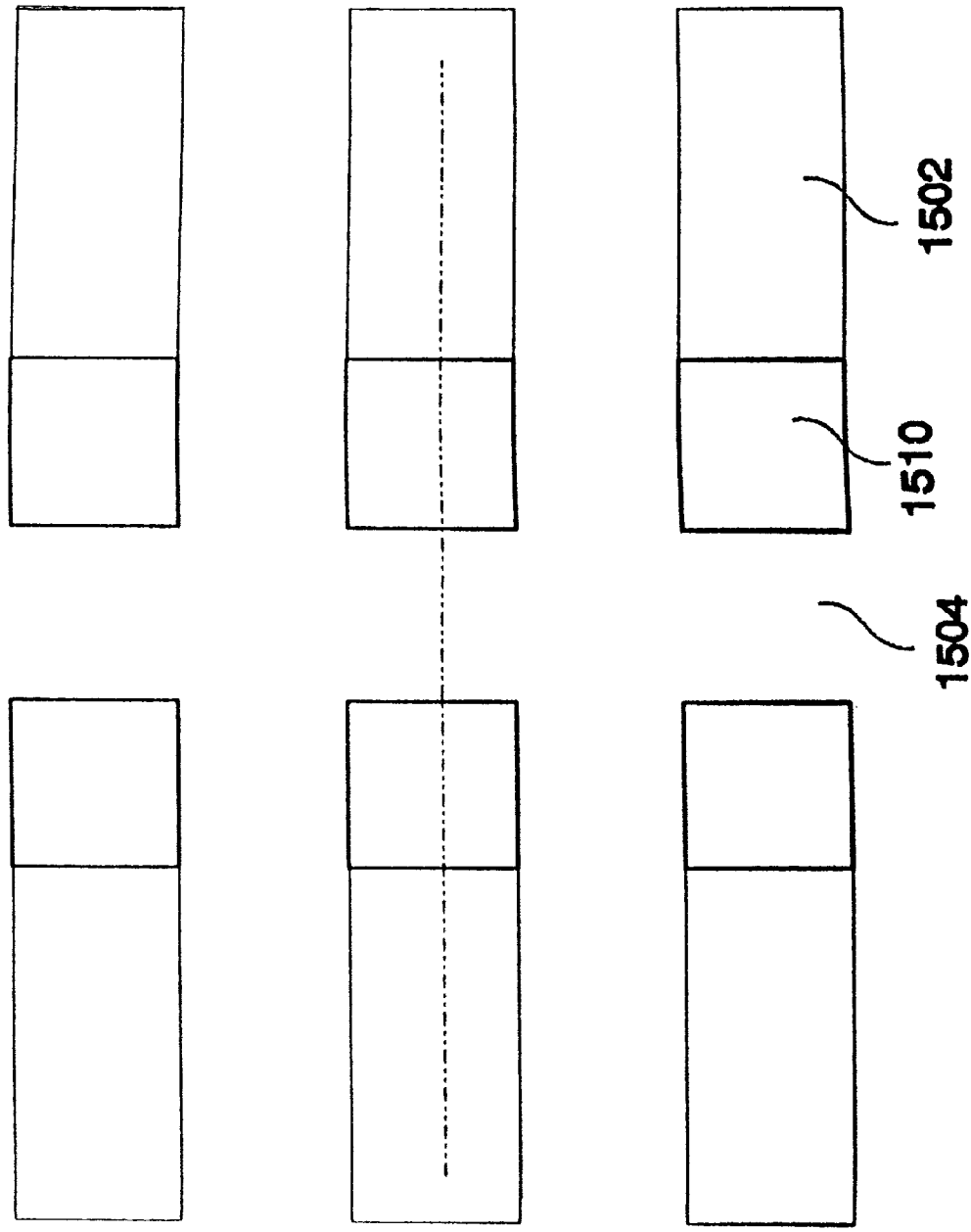
Figure 15C:
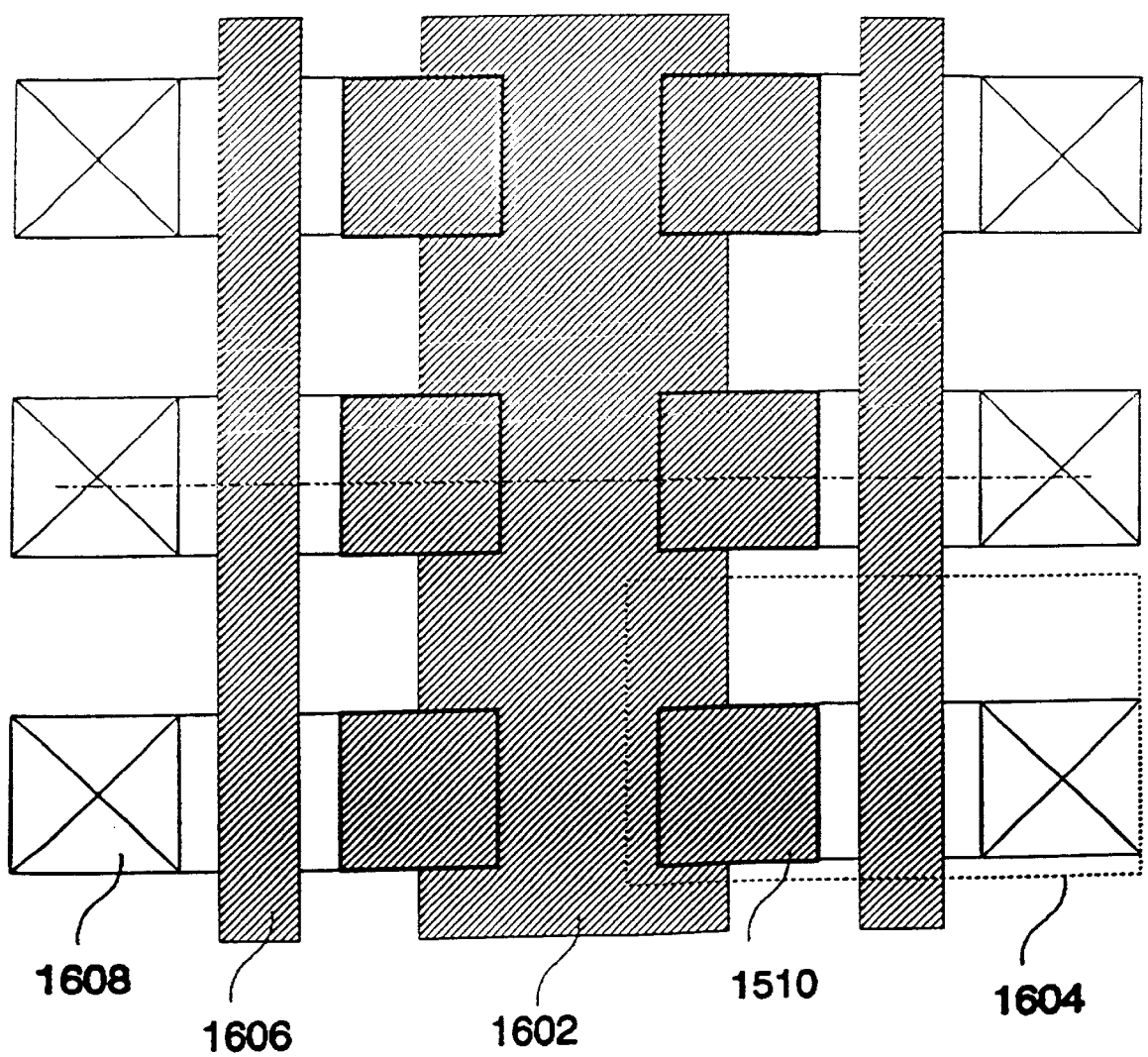

FIGS. 14(a–f) and FIGS. 15(a–c) illustrates a procedure to manufacture high density memory using a manufacture technology very similar to standard logic technology. The first step is to define active area 1502, and grow isolation field oxide 1504 to separate those active area as show in the cross section diagram in FIG. 14(a) and the top view in FIG. 15(a). This step is identical to any standard IC technology. The next step is to apply a mask 1506 to define the location of trench capacitors as illustrated by FIG. 14(b). Selective plasma etching is used to dig a trench 1510 at the opening defined by the field oxide 1504 and the trench mask 1506 as illustrated in the cross-section diagram in FIG. 14(c) and the top view in FIG. 15(b). This is a self-aligned process because three edges of the trench 1510 are defined by field oxide. The trench mask 1506 only needs to define one edge of the trench. After the above processing steps, all the following processing procedures are conventional manufacture processes of standard logic technology. First, a layer of thin insulator 1511 is grown at the surface of the active area 1502, including the surfaces of the trench 1510 as shown in FIG. 14(d). The next step is to deposit poly silicon 1512 to fill the trench 1510 and cover the whole silicon as illustrated in FIG. 14(e). A poly mask 1520 is then used for poly silicon etching process to define transistor gates 1522 and the electrode 1524 of the trench capacitor as illustrated in FIG. 14(f). FIG. 15(c) shows the top view and FIG. 15(g) shows the cross-sectional view of the resulting memory cell structure. The trench capacitors 1510 are filled with poly silicon. One electrode 1602 of all those trench capacitors 1510 are connected together through poly silicon to power supply voltage Vcc. The other electrodes of the trench capacitors are connected to the sources of select transistors 1604. The poly silicon word lines 1606 define the gates of the select transistors, and the drains of the select transistors are connected to metal bit lines through diffusion contacts 1608.

As apparent from the foregoing, following advantages are obtained according to this invention.

(1) All the procedures used to build the DRAM cell are existing procedures of standard logic technology, except one masking step and one plasma-etching step. Comparing with current art embedded memory technologies, the present invention simplifies the manufacture technology by more than 30%.

(2) The procedure to define the dimension of trench capacitor is a self-aligned procedure; three edges of the trench capacitor are defined by field oxide; only one edge is defined by mask. This self-aligned procedure allows us to minimize the area of the memory cell.

Figure 16A:
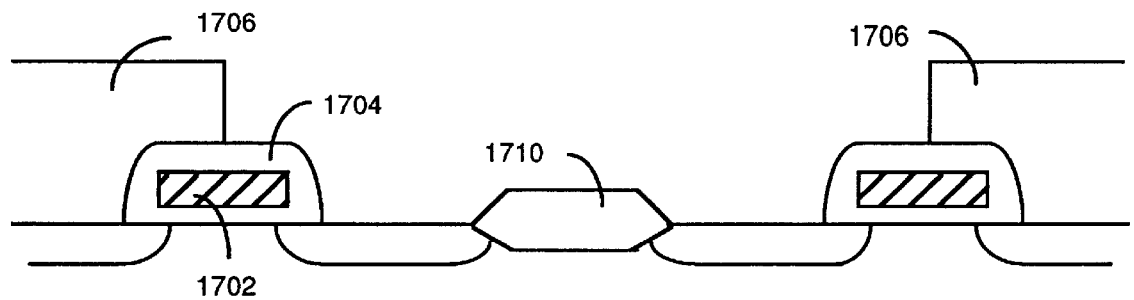
FIGS. 16(a–d) are cross-section diagrams describing another process step to manufacture a self-aligned trench capacitor for DRAM memory cell using one additional mask to standard logic technology.
Figure 16B:
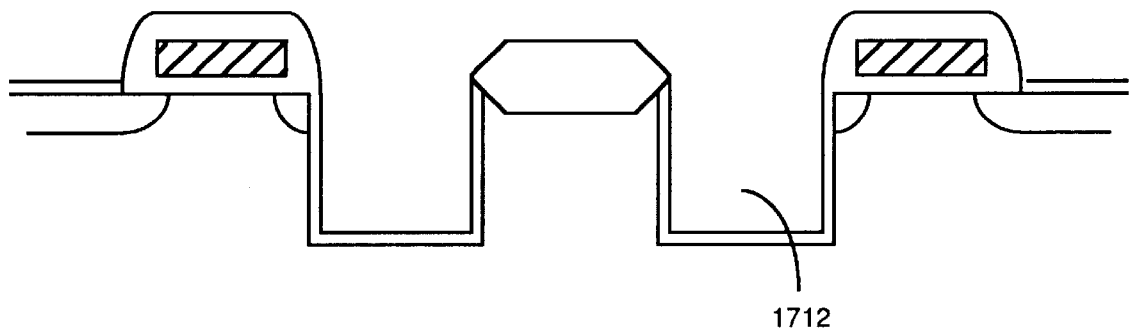
Figure 16C:
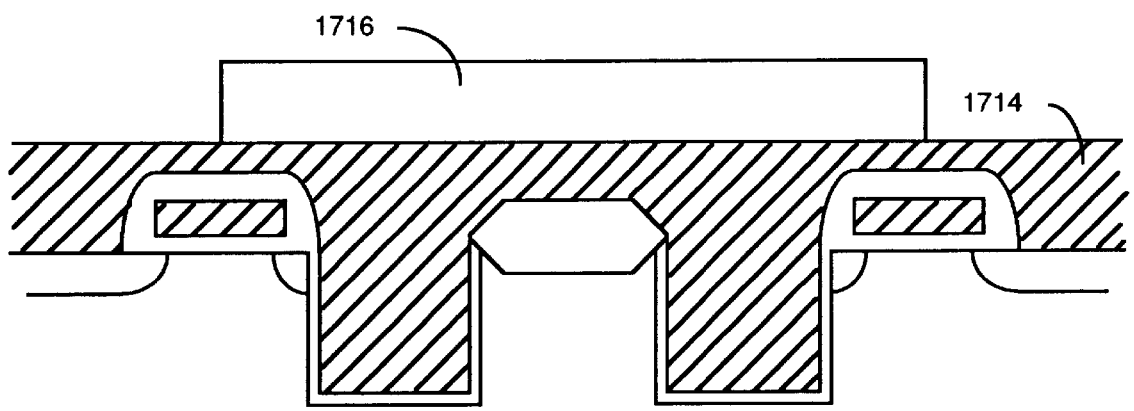
Figure 16D:
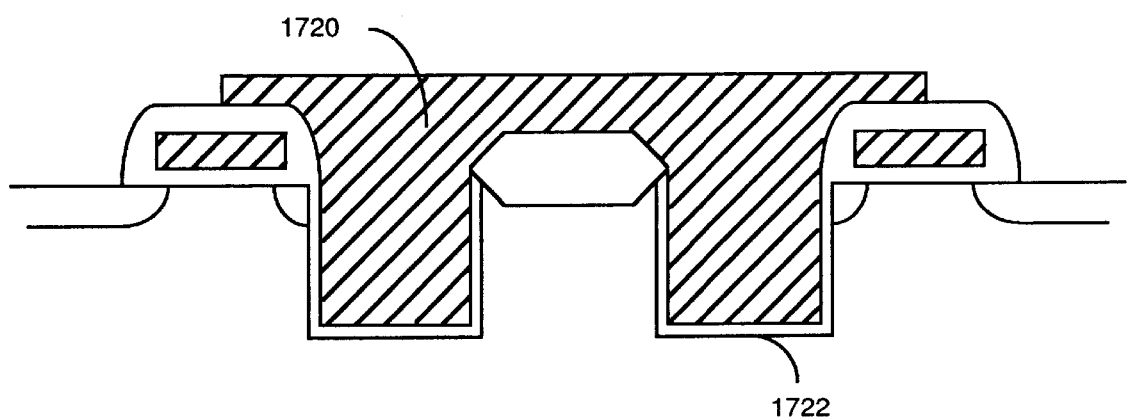
Figure 17:
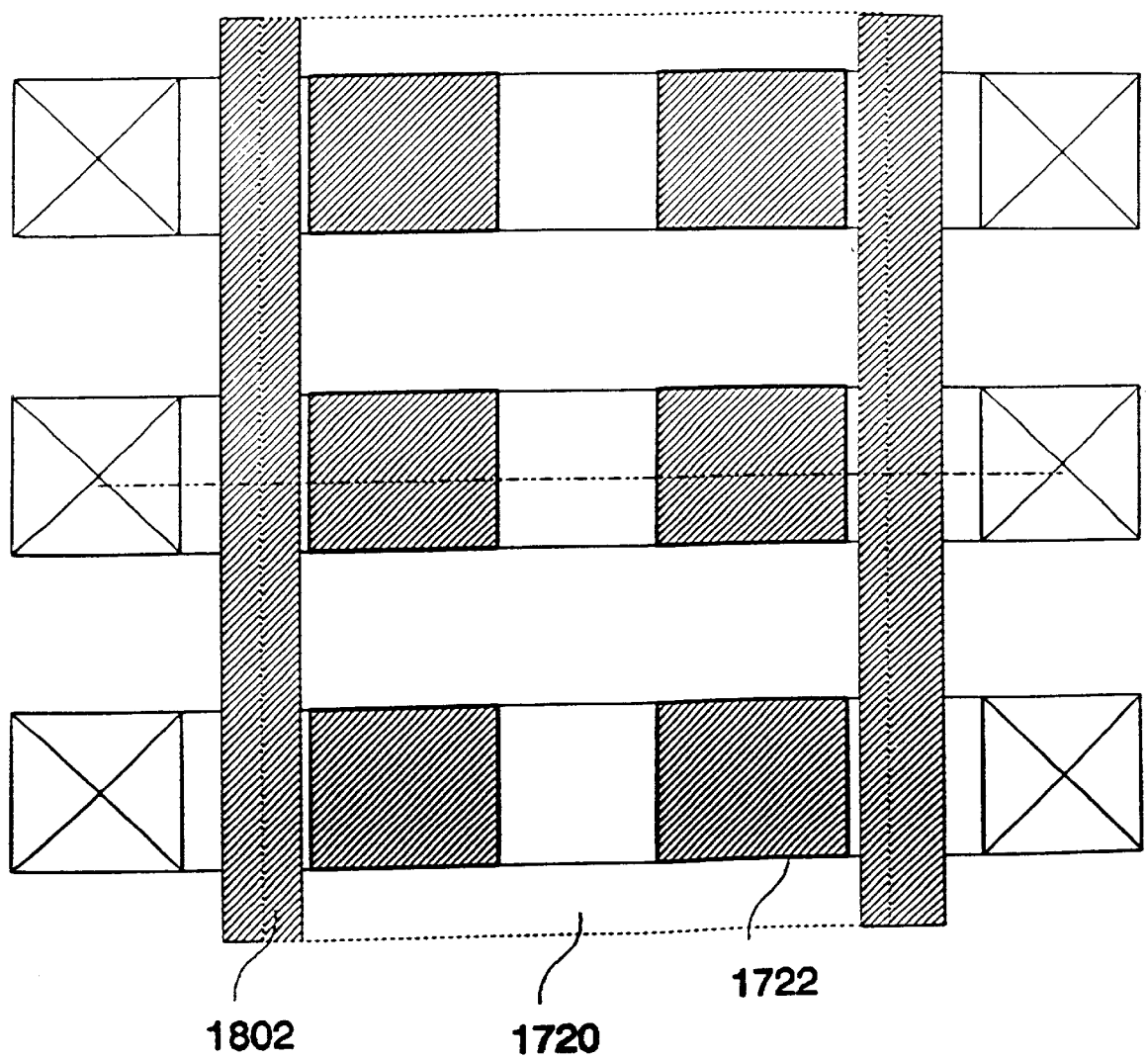
FIG. 17 shows the top view of the memory cell manufactured by the process illustrated in FIGS. 16(a) to 16(d)

Another procedure has also been developed to build self-aligned trench capacitors using logic technology. The first step is to build CMOS transistors following standard logic technology as illustrated in the cross-section diagram in FIG. 16(a). At this time, the MOS transistor has been fully processed. The poly silicon gate 1702 is already covered by oxide for protection. A trench mask 1706 is then deposited. This trench mask 1706 is used to protect area where we do not want to dig trench capacitor; it is not needed to define the dimension of the trench capacitor because all four edges of the area are already defined. Three edges are defined by the field oxide 1710 in the same way as the previous procedure, and the forth edge is define by the oxide 1704 on the transistor gate. This is therefore a complete self-aligned procedure. The following selective plasma etching procedure is therefore able to utilize optimum area for the trench capacitor as illustrated in FIG. 16(b). Thin insulation layer is grown on the surfaces of the trench 1712 before the whole area is covered by second layer poly silicon 1714 as shown in FIG. 16(c). Photo resist 1716 that is defined by the same mask as the one used in FIG. 16(a) defines the dimension of the second layer poly silicon 1716 (the polarity of the photo resist used in FIG. 16(a) is opposite to that used in FIG. 16(c). The second layer poly silicon 1716 is then etched to form the electrodes 1720 of those trench capacitors 1722. FIG. 17 shows the top view of the DRAM cells manufactured by the above procedures. The word lines 1802 are defined by the first layer poly silicon. Second layer poly silicon are used to fill the trench capacitors 1722, and to connect one electrode 1720 of all those trench capacitors to Vcc.

The above procedure is more complex than the procedure illustrated in FIGS. 14(a–g). It has the advantage that the trench capacitors are fully self-aligned for all 4 edges of their opening. Utilization of the silicon area is therefore fully optimized. While specific embodiments of the invention have been illustrated and described herein, it is realized that other modification and changes will occur to those skilled in the art. For example, the insulation-layer in the trench capacitors maybe grown in a different processing step instead of during the process of forming the gate oxide. The exact sequence of the processing steps also can be varied to achieve similar simplification.

Figure 18A:
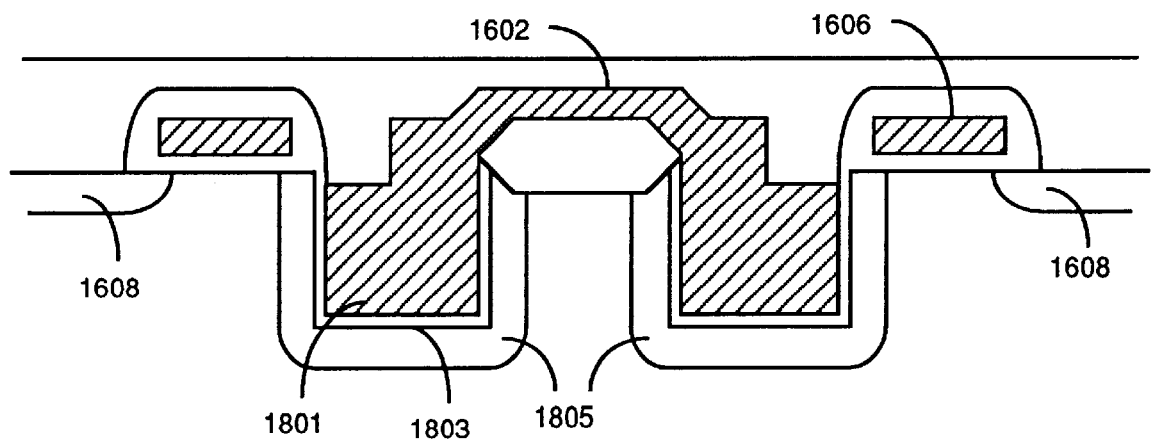
FIG. 18(a) shows the cross-section structures for capacitors that do not have the electrode voltage polarity constraint.
Figure 18B:
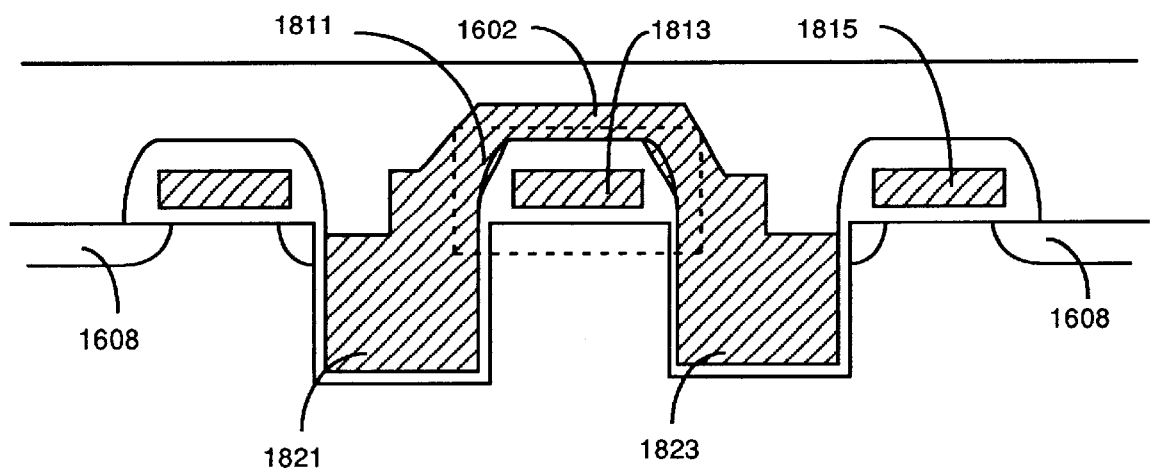
FIG. 18(b) shows the cross-section structures for memory cells that use transistors to separate nearby trench capacitors.

The top electrode (1602) of the trench capacitor (1510) of the memory cells shown in FIG. (14) must be connected to a voltage at least one threshold voltage (Vt) higher than the voltage of the bottom electrode to make the area under the insulator layer (1511) conductive. Similarly, the top electrode (1702) of the trench capacitor of the memory cells shown in FIG. (16) also must be connected to a voltage at least one Vt higher than the voltage of the bottom electrode. Typically, those top electrodes (1602,1702) are connected to power supply voltage Vcc. This constraint can be removed if a diffusion layer (1805) is deposited around the trench capacitor (1802) as illustrated by the cross-section diagram in FIG. 18(a). This diffusion layer (1805), the drain of the word line transistor (1606), and the tope electrode (1602) are all doped with the same type of doping. Therefore, the bottom electrode of the trench capacitor (1801) is always conductive, which removes the constraint on the electrode voltages. The cross-section diagram in FIG. 18(b) illustrates another variation in device structure. In this structure, a transistor (1811) instead of field oxide separates two nearby trench capacitors (1821, 1823). The gate (1813) of this isolation transistor (1811) is connected to ground voltage Vss to separate nearby trench capacitors (1821, 1823). Transistors (1811, 1815) therefore define two edges of the areas of the trench capacitors (1821, 1823) instead of field oxide, which usually helps to reduce the size of memory cells.

Figure 19:
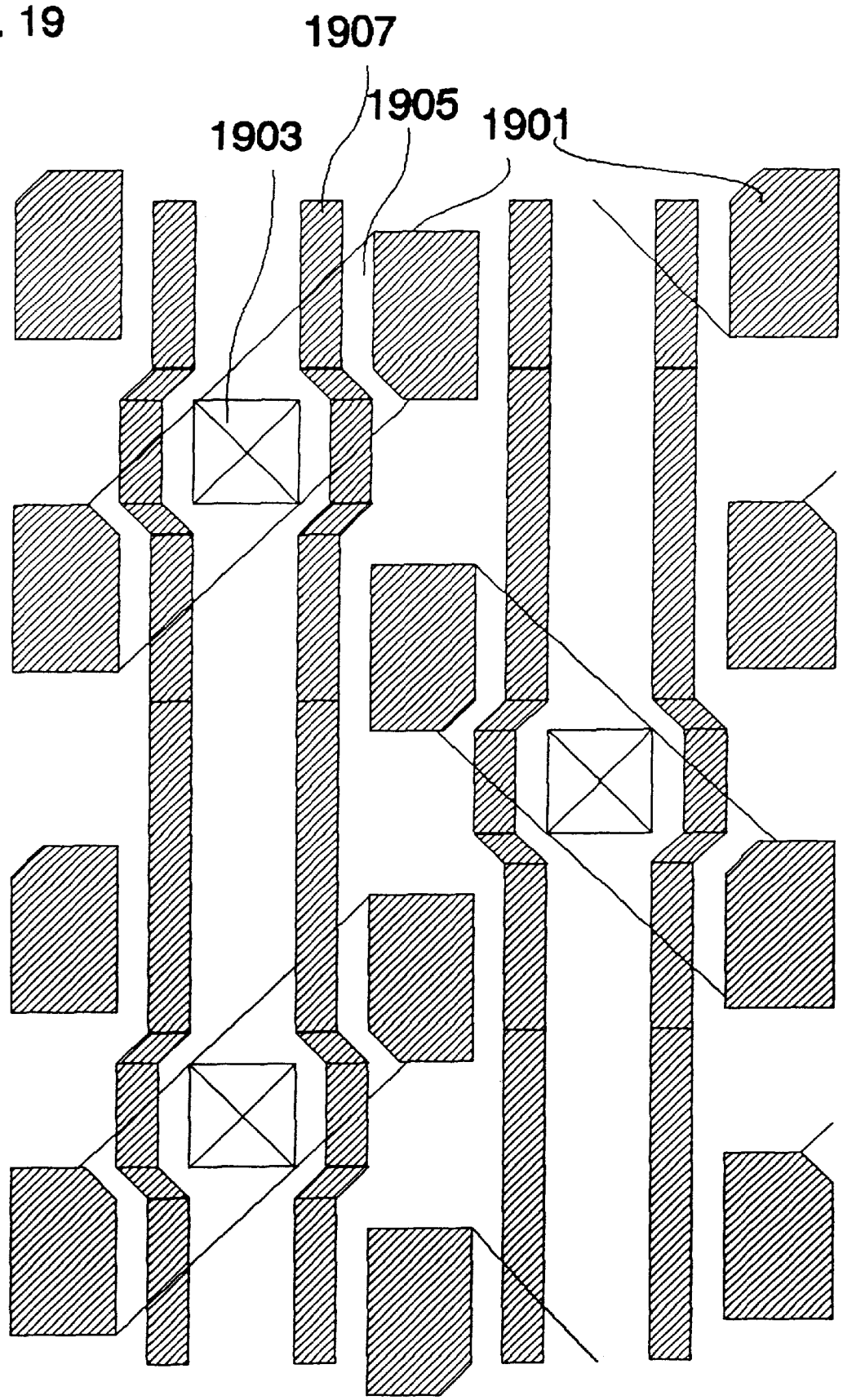
FIG. 19 illustrates the top view structure of practical memory cells of the present invention.

In the above examples, the geometry of memory cell structures is drawn in 90-degree angles for simplicity. In reality, memory cells are often drawn in multiple angles as illustrated by the top view memory cell structures in FIG. 19. The trench capacitors (1901) are placed in 45 degree to the contacts (1903). The word line (1907) and the diffusion area (1905) are also placed in 45-degree angles. Since the area of the trench capacitors (1901) are defined by field oxide and transistor edges, its shape is therefore not necessary rectangular as shown by the example in FIG. 19.

The word line transistor (1402) in the memory cell of the present invention has the same properties and it is manufactured in the same time as the transistors used for peripheral circuits and logic circuits. The word line transistors of prior art DRAM technologies are always different from logic transistors. In order to tolerate higher word line voltage introduced by the word line boosting circuits, the gate oxide thickness (Tox) of a prior art word line transistor is thicker than that of a logic transistor. In order to reduce leakage current, the threshold voltage (Vt) of a prior art word-line-transistor is higher. Table 1 lists transistor properties for a typical 0.35 um DRAM technology. The word line transistor and the logic transistor in this example is manufactured by the same procedures except that one masking step is added to increase Vt of the word line transistor. The word line transistor has higher Vt (1.1 volts for the example in Table 1) so that it can be drawn to a smaller minimum channel length (Lmin), which is 0.35 um in this case, without leakage problems. The logic transistor has lower Vt (0.7 volts for this example), but its Lmin is larger. On the other word, the logic transistors of a typical DRAM technology is equivalent to the logic transistors of 0.5 um technology instead of 0.35 um technology. On the other word, the performance of logic transistors of DRAM technology is one generation behind the transistors of typical logic technology.

One method to have both high performance logic transistors and low leakage DRAM transistors on the same chip is to make different kinds of transistors using complex manufacture procedures. Table 2 shows the transistor properties for one example of such complex embedded memory technology. This technology has word line transistor with high Vt and thick oxide, high voltage transistors with thick oxide and long channel length, and logic transistors with low Vt and thin oxide. The manufacture procedures for such technology are very complex. The manufacture cost is very high.

TABLE 1

Transistor properties for word line transistors and logic transistors of prior art DRAM technology.

|  | Tox | Vt (volts) | Lmin (micrometers) |
|---|---|---|---|
| Word line transistor | 100 | 1.1 | 0.35 |
| Logic transistor | 100 | 0.7 | 0.5 |

TABLE 2

Transistor properties for word line transistors and logic transistors of prior art embedded DRAM technology.

|  | Tox | Vt (volts) | Lmin (micrometers) |
|---|---|---|---|
| Word line transistor | 100 | 1.1 | 0.35 |
| High Voltage transistor | 100 | 0.7 | 0.5 |
| Logic transistor | 70 | 0.7 | 0.35 |

A DRAM (dynamic random access memory) cell array supported on a substrate is therefore disclosed in this invention. The DRAM cell array includes a plurality of memory cells each having a select-transistor wherein each of the select-transistor having a select-transistor-gate. The DRAM cell array further includes a peripheral logic-circuit having logic-transistors wherein each of the logic-transistors having a logic-transistor-gate. The select-transistor-gate and the logic-circuit-gate have substantially a same thickness. And, the select-transistor for each of the memory cells having a select-transistor threshold voltage and each of the logic-transistors of the peripheral logic-circuit having a logic-transistor threshold voltage wherein the select-transistor threshold voltage is substantially the same as the logic-transistor threshold voltage. In a preferred embodiment, each of the memory cells further having a trench capacitor. In another preferred embodiment, the DRAM cell array further includes an active area isolated and defined by edges of a field oxide layer disposed on the substrate wherein each of the trench capacitors disposed in the active area and in self-alignment with the edges of the field oxide layer. In another preferred embodiment, the DRAM cell array further includes an active area isolated and defined by edges of a field oxide layer disposed on the substrate. Each of the trench capacitors is disposed in the active area and in self-alignment with the edges of the field oxide layer and edges of the select-transistor gate. In another preferred embodiment, the DRAM cell array further includes an error code checking (ECC) and correction means connected to the memory cell array for checking and correcting substantially all memory read errors within a threshold error-detection-and-correction time.

According to above description, this invention discloses a method for manufacturing a DRAM (dynamic random access memory) cell array each having a select-transistor and peripheral logic circuit having logic-transistors supported on a substrate. The method includes the steps of (a) applying a gate-formation process for simultaneously forming a select-transistor-gate for the select-transistor and a logic-circuit-gate for each of the logic-transistors for the peripheral logic-circuit wherein the select-transistor-gate and the logic-circuit-gate having substantially a same thickness; and (b) applying substantially same implant processes in forming the select-transistor and the logic-transistors wherein the select-transistor and the logic transistors having substantially a same threshold voltage. In a preferred embodiment, the method further includes a step of (c) applying a capacitive-transistor trench mask for etching a plurality of trench capacitors for the memory cell array. In a preferred embodiment, the step of applying a capacitive-transistor trench mask is a step of applying a capacitive-transistor trench mask in an active area isolated by a field oxide. The capacitive-transistor trench mask cooperates with the filed oxide for etching the trench in self-alignment in the active area with etching edges defined by the field oxide. In another preferred embodiment, the step of applying a capacitive-transistor trench mask in corporation with the field oxide is a step of applying a capacitive-transistor trench mask in an active area isolated by the field oxide as an enclosed area. The capacitive-transistor trench mask is employed to define a single edge of the trench capacitor while remaining edges of the trench capacitor are in self-alignment with the field oxide wherein the etching edges for the remaining edges are inherently defined in the active area by the filed oxide. In another preferred embodiment, the step of applying a capacitive-transistor trench mask in corporation with the field oxide is a step of applying a capacitive-transistor trench mask in an active area isolated as an enclosed area by the filed oxide and a gate in the active area. The capacitive-transistor trench mask is employed to define a single edge of the trench capacitor while remaining edges of the trench capacitor are in self-alignment with the field oxide and the gate. The etching edges for the remaining edges are inherently defined in the active area by the field oxide and the gate. In a preferred embodiment, the method further includes steps of: (d) removing the capacitive-transistor trench mask after etching the trench capacitor followed by filling the capacitor trench with a layer of polycrystalline silicon overlaying the active area; and (e) applying the capacitive-transistor trench mask again in opposite polarity relative to the step described above to etch the polycrystalline layer to define a contact opening to the trench capacitor.

According to above drawings and descriptions, this invention also discloses a method for manufacturing a DRAM (dynamic random access memory) cell array on a substrate. The method includes the steps of (a) forming logic transistors on the substrate having polysilicon gates covered by an insulation protective layer wherein the insulation protective layer disposed next to a field oxide layer defining open areas therein-between; and (b) forming trench capacitors for the memory cells by etching the open areas with edges of the trenches defined by the insulation protective layer and the field oxide layer. In a preferred embodiment, the step of forming logic transistors on the substrate having polysilicon gates comprising a step of forming word-line (WL) select transistors each having a WL-transistor gate padded with a WL-select gate-oxide layer having a thickness substantially the same as a gate oxide layer padded under the polysilicon gates of the logic transistors. In another preferred embodiment, the method further includes a step of (c) connecting an error code checking (ECC) and correction means to the memory cell array for checking and correcting substantially all memory read errors within a threshold error-detection-and-correction time. In another preferred embodiment, the method further includes a step of (e) forming a diffusion layer surrounding the trenches having a same conductivity type as a drain of the logic transistors. In another preferred embodiment, the method further includes a step of (f) forming logic transistors on the substrate having polysilicon gates covered by an insulation protective layer; (f) connecting the gate of a plurality of the logic transistors to a ground voltage thus defining a plurality of isolation transistors each separating two adjacent logic transistors wherein the insulation protective layer of the isolation transistors and the adjacent logic transistors defining open areas therein-between; and (g) forming trench capacitors for the memory cells by etching the open areas with edges of the trenches defined by the insulation protective layer of the isolation transistors and the adjacent logic transistors.

An embedded technology of the present invention uses high performance transistor to support both logic circuits and memory circuits. The circuit performance is high, and the manufacture procedures are simple. However, the leakage current caused by the word line transistor is higher than that of prior art word line transistor. Since the thin gate device can not tolerate high voltage operation, we can not use word line boost method to increase storage charge. It is therefore necessary to provide novel design methods to improve the tolerance in leakage current and storage charge loss. U.S. Pat. No. 5,748,547 disclosed methods that can improve signal-to-noise ratio of DRAM array without increasing device area. Using the method, memory devices can be functional without using boosted word line voltages. The same patent disclosed novel self-refresh mechanism that is invisible to external users while using much less power. Using the self-refresh mechanism to increase refresh frequency internally, we can tolerate higher memory leakage current without violating existing memory specifications. Another important method is to use the error-correction-code (ECC) protection to improve the tolerance in non-ideal memory properties.

Figure 20A:
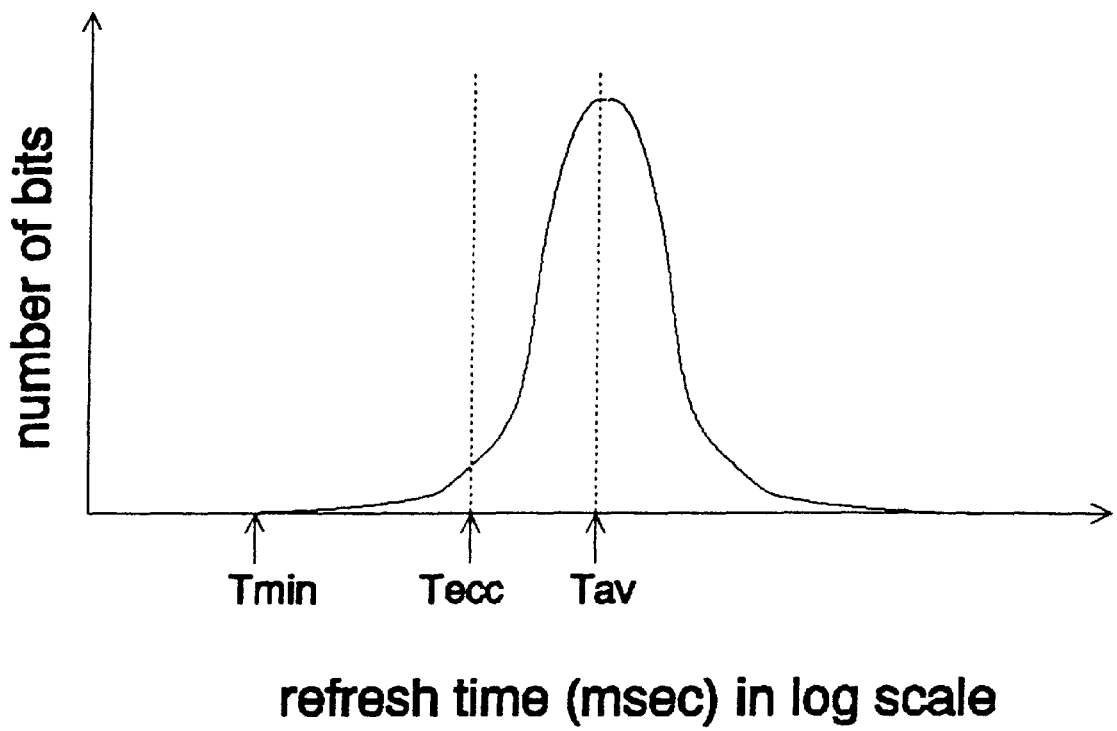
FIG. 20(a) shows a typical distribution of memory refresh time for the memory cells in a large DRAM.
Figure 20B:
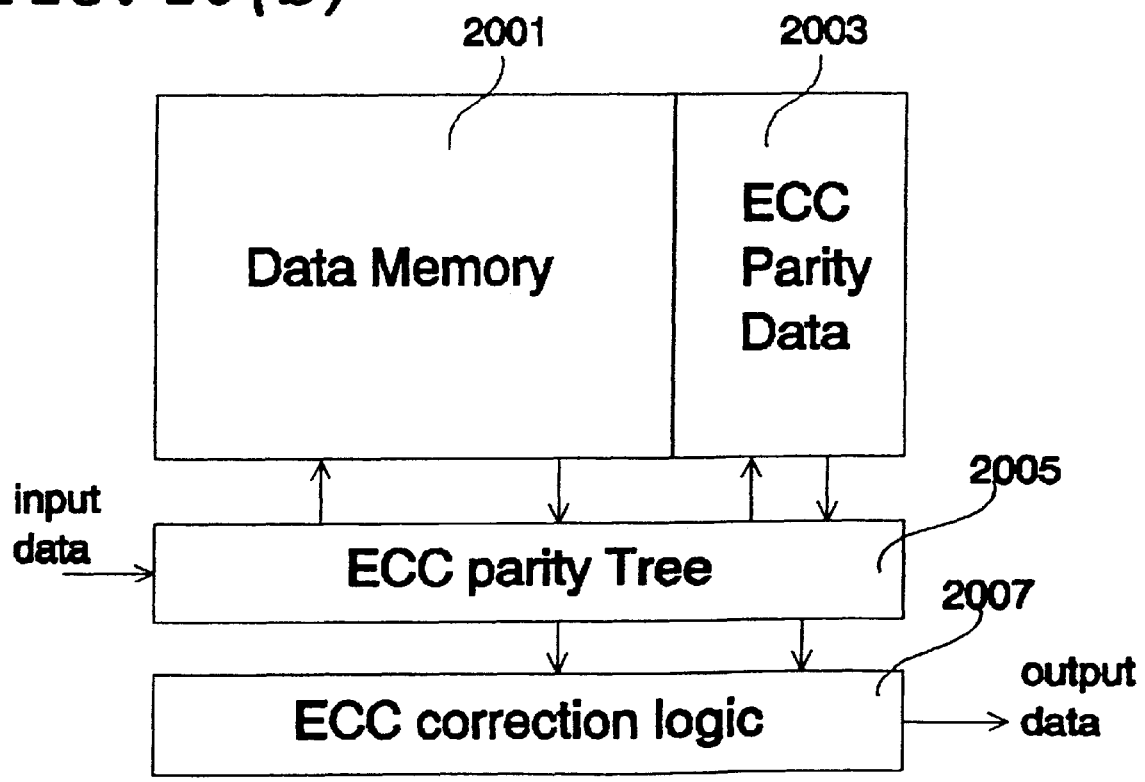
FIG. 20(b) is a symbolic diagram for a DRAM equipped with error-correction-code (ECC) protection circuit.

FIG. 20(a) shows a typical distribution for the refresh time required by the memory cells in a large memory device. For a prior art memory device, the refresh time of the worst bit, i. e., (Tmin), determines its refresh time, among millions of memory cells in the memory device. This worst bit refresh time (Tmin) is typically many orders of magnitudes shorter than the average refresh time (Tav), because the worst bit is always caused by defective structures in the memory cell. FIG. 20(b) shows the simplified block diagram of a memory device equipped with ECC protection circuits. During a memory write operation, the input data is processed by a ECC parity tree (2005) to calculate ECC parity data. The input data is stored into a normal data memory array (2001) while the ECC parity data is stored into a parity data array (2003). During a read operation, stored data as well as ECC parity data are read from the memory arrays (2001,2003) and sent to the ECC parity tree (2005). In case there are corruption data, an ECC correction logic (2007) will find out the problem and correct the error so that the output data will be correct. The ECC correction mechanism is known to the art, but it has not been used on low-cost DRAM because it will require more area. The present invention use ECC protection as a method to improve the tolerance in memory cell leakage current. When a memory device is equipped with an ECC circuit, it will correct most single-bit errors. As a result, the refresh time of the memory device is no longer dependent on the worst bit in the memory. Instead, the device will be function until the errors are more than what the ECC mechanism can correct. The refresh time (Tecc) is therefore higher than Tmin as shown in FIG. 20(a). Base on the above novel design methods, practical memory devices using high performance logic transistor in DRAM memory cells have been manufactured successfully.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A method for organizing M single-bit erasable programmable read-only memory (EPROM) cells into N blocks, where M is a multiplication-product of N by I by J. and N, I and J are positive integers, the method comprising steps of:

(a) dividing said M single-bit EPROM memory cells into N blocks where each of said block includes {J(j)×I} single-bit memory cells, and where j=1, 2, 3, . . . , N, and said positive integer I representing a bit length of a stored data;

(b) arranging said single-bit EPROM memory cells in each of said blocks into a J(j)-by-I two dimensional array and by connecting every I single EPROM memory cells with a first level bit line in a first bit-line direction and every J(j) single-bit EPROM memory cells by a first level word line wherein each said first level word lines and said first level bit lines intersect at one of said single-bit EPROM memory cells;

(c) connecting each of said I first level bit lines in each of said blocks to a corresponding multiple-block first level bit-lines, i. e. , multiple-block bit-line-i where i=1, 2, 3, . . . I, wherein said multiple-block first-level bit lines being arranged in a second bit-line direction different from said first-bit line direction and each being connected to a corresponding first level sense-amplifier-i where i32 1, 2, 3, . . . I; and (d) applying a block select signal to activate one of said J(j) first level word lines in one of said blocks, i. e. , block-n where n is a positive integer ranging from 1 to N, and employing said I sense amplifiers for detecting memory-cell signals from each of said first level I bit lines of said block n for reading data therefrom whereby said N blocks sharing said I sense amplifiers.

2. A memory array unit including M single-bit erasable programmable read-only memory (EPROM) cells organized into N blocks, where M is a multiplication-product of N by I by J, and N, I and J are positive integers, the memory array unit are operated with N first level sense amplifiers, said unit comprising:

N blocks of EPROM memory array where each of said blocks includes {J(j)×I} single-bit EPROM memory cells, and where j=1, 2, 3,. , N, and said positive integer I representing a bit length of a stored data;

each of said blocks includes a J(j)-by-I two dimensional array and wherein every I single memory cells being connected with a first level bit line along a first bit-line direction and every J(j) single-memory cells are connected by a first level word line wherein each said first level word lines and said first level bit lines intersect at one of said single-bit EPROM memory cells;

each of said I first level bit lines in each of said blocks being connected to a corresponding multiple-block first level bit-lines, i. e. , multiple-block bit-line-i where i=1, 2, 3, . . . I, wherein said multiple-block first-level bit lines being arranged in a second bit-line direction different from said first-bit line direction and each being connected to said corresponding first level sense-amplifier-i where i=1, 2, 3, . . . I; and;

a block select signal means for activating a block select signal to activate one of said J(j) first level word lines in one of said blocks, i. e. , block-n where n is a positive integer ranging from 1 to N, and wherein said I sense amplifiers being activated for detecting memory-cell signals from each of said first level I bit lines of said block n for reading data therefrom whereby said N blocks sharing said I first level sense amplifiers.

3. A semiconductor erasable programmable read-only memory (EPROM) device provided for operation with a plurality of first level sense-amplifiers comprising:

an EPROM memory cell array having a plurality of first-direction first-level bit lines disposed in a parallel manner along a first direction;

said EPROM memory cell array further includes a plurality of word lines intersected with said first-direction first-level bit lines;

said EPROM memory cell array further includes a plurality of EPROM memory cells wherein each of said plurality of memory cells being coupled between one of said first-direction first level bit lines and one of said word lines for storing data therein;

a plurality of different-direction first level bit lines disposed along at least one different direction different from said first direction, wherein each of said different-direction first level bit lines connected between a plurality of said first-direction first level bit lines and one of said first level sense amplifiers.

4. The semiconductor EPROM memory device of claim 3 further comprising:

an EPROM memory-cell selection means for activating several memory cells along one of the word lines for sending signals to the first level sense amplifiers via the first-direction first level bit lines and the different-direction first level bit lines to detect data stored in the several memory cells.

5. The semiconductor EPROM memory device of claim 3 wherein:

the one of the different directions for arranging the different-direction first level bit lines being perpendicular to the first direction for arranging the first-direction first level bit lines.

6. The semiconductor EPROM memory device of claim 3 wherein:

the different directions for arranging the different-direction first level bit lines being a second-direction for arranging a plurality of second-direction first level bit line and the second-direction being different from the first direction for arranging the first-direction first level bit lines.

7. The semiconductor EPROM memory device of claim 3 further comprising:

bit line switches connected between the first-direction first level bit lines and the different-direction first level bit lines for selectively switching and activating the bit lines.

8. A semiconductor erasable programmable read-only memory (EPROM) device provided for operation with a plurality of first level sense-circuits comprising:

an EPROM memory cell array having a plurality of first-direction first-level bit lines disposed in a parallel manner along a first direction;

said EPROM memory cell array further includes a plurality of word lines intersected with said first-direction first-level bit lines;

said EPROM memory cell array further includes a plurality of EPROM memory cells wherein each of said plurality of memory cells being coupled between one of said first-direction first level bit lines and one of said word lines for storing data therein;

a plurality of different-direction first level bit lines disposed along at least one different direction different from said first direction, wherein each of said different-direction first level bit lines connected between a plurality of said first-direction first level bit lines and one of said first level sense-circuits.

9. The semiconductor EPROM memory device of claim 8 wherein:

each of said first level sensing-circuits further connected to a sense-amplifier enable line for enabling said first level sensing-circuits.

10. A method for configuring a semiconductor EPROM memory device for operation with a plurality of first level sense-amplifiers comprising:

arranging a plurality of first-direction first-level bit lines in a parallel manner along a first direction;

arranging a plurality of word lines for intersecting with the first-direction first-level bit lines;

coupling an EPROM memory cell between each of the first-direction first level bit lines and one of the word lines for storing data therein;

arranging a plurality of different-direction first level bit lines along at least a different direction different from the first direction; and connecting each of the different-direction first level bit lines between a plurality of the first-direction first level bit lines and one of the first level sense amplifiers.

11. The method of configuring the semiconductor EPROM memory device of claim 10 further comprising:

applying a memory-cell selection means for activating several EPROM memory cells along one of the word lines for sending signals to the first level sense amplifiers via the first-direction first level bit lines and the different-direction first level bit lines to detect data stored in the several EPROM memory cells.

12. The method of configuration the semiconductor EPROM memory device of claim 10 wherein:

configuring one of the different directions for arranging the different-direction first level bit lines to be perpendicular to the first direction for arranging the first-direction first level bit lines.

13. The method for configuring the semiconductor EPROM memory device of claim 10 wherein:

configuring the different directions for arranging the different-direction first level bit lines by configuring a second-direction for arranging a plurality of second-direction first level bit line and the second-direction being different from the first direction for arranging the first-direction first level bit lines.

14. The method of configuring the semiconductor EPROM memory device of claim 13 further comprising:

interconnecting bit line switches between the first-direction first level bit lines and the different-direction first level bit lines for selectively switching and activating the bit lines.

15. A method for configuring a semiconductor EPROM memory device for operation with a plurality of first level sensing-circuit comprising:

arranging a plurality of first-direction first-level bit lines in a parallel manner along a first direction;

arranging a plurality of word lines for intersecting with the first-direction first-level bit lines;

coupling an EPROM memory cell between each of the first-direction first level bit lines and one of the word lines for storing data therein;

arranging a plurality of different-direction first level bit lines along at least a different direction different from the first direction;

connecting each of the different-direction first level bit lines between a plurality of the first-direction first level bit lines and one of the first level sensing circuits.

16. The method of claim 15 wherein:

said step of connecting each of the different-direction first level bit lines between a plurality of the first-direction first level bit lines and one of the first level sensing circuits is a step of connecting each of the different-direction first level bit lines and a sense-amplifier enable line between a plurality of the first-direction first level bit lines and aid first level sensing-circuits.

* * * * *

UNITED STATES PATENT AND TRADEMARK OFFICE
CERTIFICATE OF CORRECTION

PATENT NO. : 6,504,745 B2
DATED : January 7, 2003
INVENTOR(S) : Jeng-Jye Shau

It is certified that error appears in the above-identified patent and that said Letters Patent is hereby corrected as shown below:

Title page,
Item [63], Related U.S. Application Data, after "Continuation-in-part" insert therein the following phrase:
-- of application No. 09/753,635 filed Jan. 2, 2001, now Pat. No. 6,343,045, which is a continuation-in-part of application No. 08/989,841, filed Dec. 12, 1997, now Pat. No. 6,216,246, which is a continuation-in-part --; and after "now Pat. No. 5,748,547," insert the following phrase:
-- , this application is also a continuation-in-part of application No. 09/790,356 filed on Feb. 20, 2001, pending, which is a divisional of application No. 08/989,841, filed Dec. 12, 1997, now Pat. No. 6,216,246, which is a continuation-in-part of application No. 08/805,290, filed on Feb. 25, 1997, now Pat. No. 5,825,704, and a continuation-in-part of application No. 08/653,620, filed on May 24, 1996, now Pat. No. 5,748,547 --

Column 1,
Delete lines 1-14 and insert therein:
          -- This application is a continuation-in-part of application No. 09/753,635 filed Jan. 2, 2001, now Pat. No. 6,343,045, which is a continuation-in-part of application No. 08/989,841, filed Dec. 12, 1997, now Pat. No. 6,216,246, which is a continuation-in-part of application No. 08/805,290, filed on Feb. 25, 1997, now Pat. No. 5,825,704, and a continuation-in-part of application No. 08/653,620, filed on May 24, 1996, now Pat. No. 5,748,547, this application is also a continuation-in-part of application No. 09/790,356 filed on Feb. 20, 2001, pending, which is a divisional of application No. 08/989,841, filed Dec. 12, 1997, now Pat. No. 6,216,246, which is a continuation-in-part of application No. 08/805,290, filed on Feb. 25, 1997, now Pat. No. 5,825,704, and a continuation-in-part of application No. 08/653,620, filed on May 24, 1996, now Pat. No. 5,748,547. --

Signed and Sealed this

Seventh Day of June, 2005

JON W. DUDAS
*Director of the United States Patent and Trademark Office*